United States Patent
Lee et al.

(10) Patent No.: US 6,696,363 B2
(45) Date of Patent: Feb. 24, 2004

(54) METHOD OF AND APPARATUS FOR SUBSTRATE PRE-TREATMENT

(75) Inventors: Wai M. Lee, Fremont, CA (US); David J. Maloney, Pleasanton, CA (US); Paul J. Roman, Pleasanton, CA (US); Michael A. Fury, San Francisco, CA (US); Ross H. Hill, Coquitlam (CA); Clifford Henderson, Conyers, GA (US); Sean Barstow, Atlanta, GA (US)

(73) Assignee: EKC Technology, Inc., Hayward, CA (US)

( * ) Notice: Subject to any disclaimer, the term of this patent is extended or adjusted under 35 U.S.C. 154(b) by 147 days.

(21) Appl. No.: 09/874,330

(22) Filed: Jun. 6, 2001

(65) Prior Publication Data

US 2002/0037481 A1 Mar. 28, 2002

Related U.S. Application Data

(60) Provisional application No. 60/209,947, filed on Jun. 6, 2000.

(51) Int. Cl.$^7$ ................................................ H01L 21/44
(52) U.S. Cl. .................... 438/681; 430/312; 427/100
(58) Field of Search ......................... 430/323, 312; 438/681; 427/100

(56) References Cited

U.S. PATENT DOCUMENTS

| | | | |
|---|---|---|---|
| 4,770,590 A | 9/1988 | Hugues et al. | 414/172 |
| 5,140,366 A | 8/1992 | Shiozawa et al. | 355/53 |
| 5,178,989 A | 1/1993 | Heller et al. | 430/323 |
| 5,272,099 A | 12/1993 | Chou et al. | 437/41 |
| 5,292,558 A * | 3/1994 | Heller et al. | 216/13 |
| 5,436,176 A | 7/1995 | Shimizu et al. | 606/71 |
| 5,534,312 A | 7/1996 | Hill et al. | 427/533 |
| 5,627,087 A | 5/1997 | Hsu et al. | 438/302 |
| 5,652,166 A | 7/1997 | Sun et al. | 437/56 |
| 5,716,758 A | 2/1998 | Bae et al. | 430/312 |
| 5,935,762 A | 8/1999 | Dai et al. | 430/312 |
| 5,989,759 A | 11/1999 | Ando et al. | 430/22 |
| 6,072,207 A | 6/2000 | Yoshimori et al. | 257/295 |
| 6,307,087 B1 | 10/2001 | Buchwald et al. | 558/388 |
| 6,387,012 B1 * | 5/2002 | Mitamura | 427/100 |

OTHER PUBLICATIONS

Copy of the International Search Report (PCT/US02/17588), dated Sep. 11, 2002.

* cited by examiner

*Primary Examiner*—W. David Coleman
(74) *Attorney, Agent, or Firm*—Pennie & Edmonds LLP

(57) ABSTRACT

The present invention relates generally to a method and apparatus for converting a precursor material, preferably organometallic, to a film, preferably metal-containing, that is adherent to at least a portion of a substrate. Both method and apparatus include a pre-conversion step or section, and a step or section for substantial conversion of a portion of material from the pre-conversion step or section into the form of a predetermined pattern, wherein this substantial conversion results in a metal-containing patterned layer on the substrate.

35 Claims, 11 Drawing Sheets

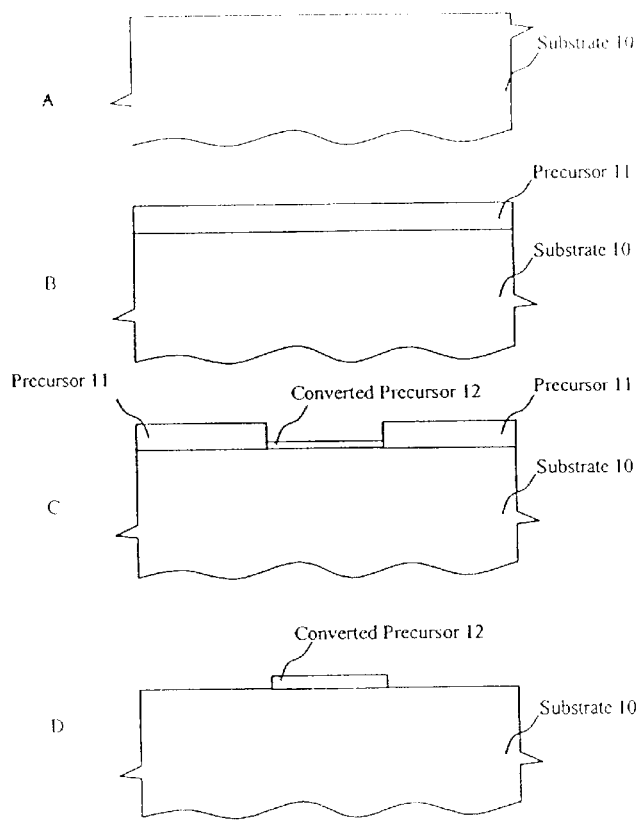
Figure 1. Illustration of basic photochemical metal organic deposition process steps.

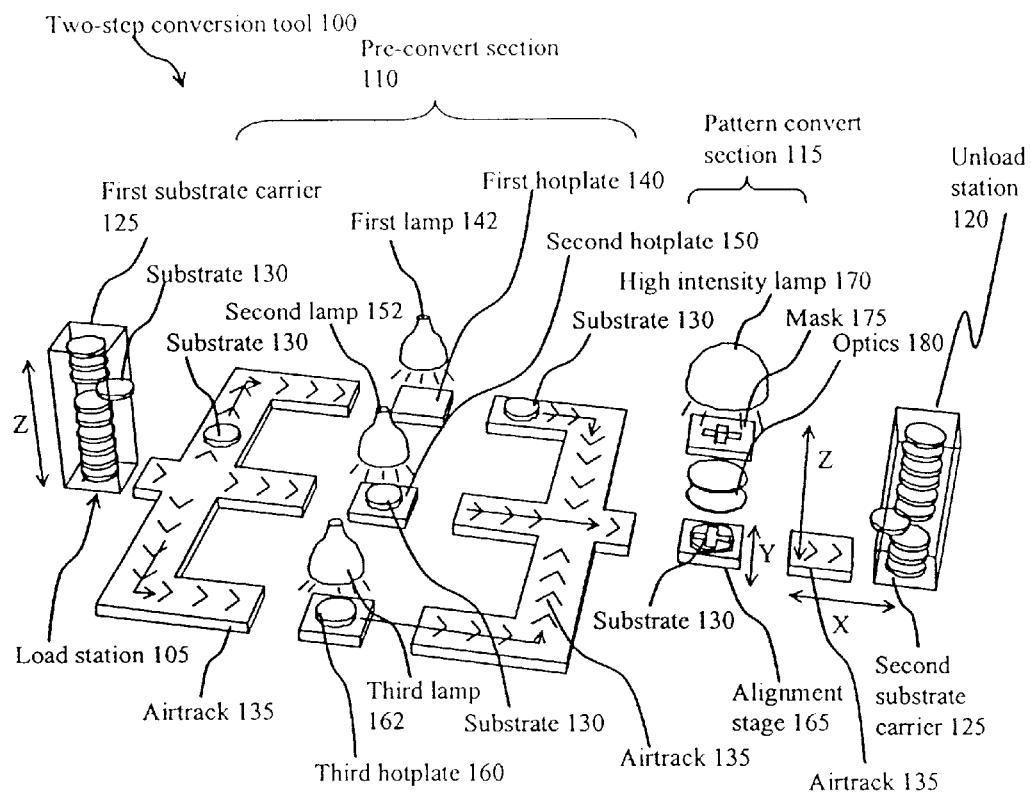
Figure 2. Apparatus for two-step conversion of precursor.

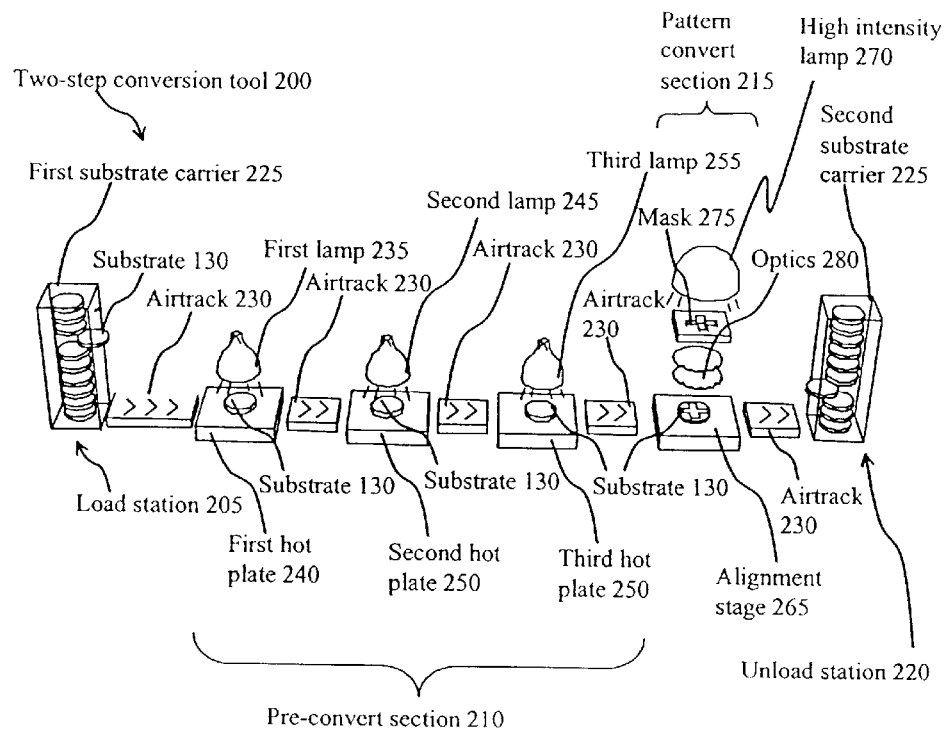
Figure 3. Alternate configuration of apparatus for two-step conversion of precursor.

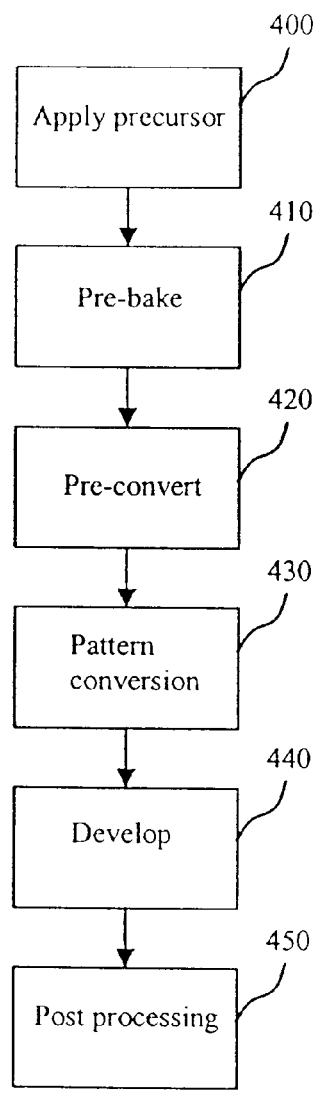
Figure 4. Method of two-step conversion of precursor.

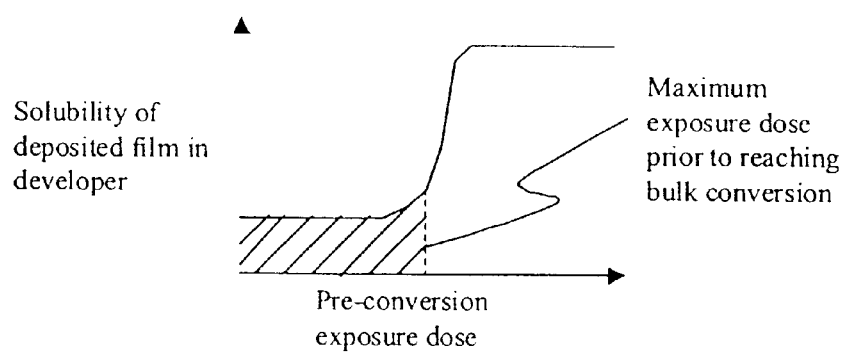
Figure 5: Pre-conversion exposure dose vs. percent precursor converted.

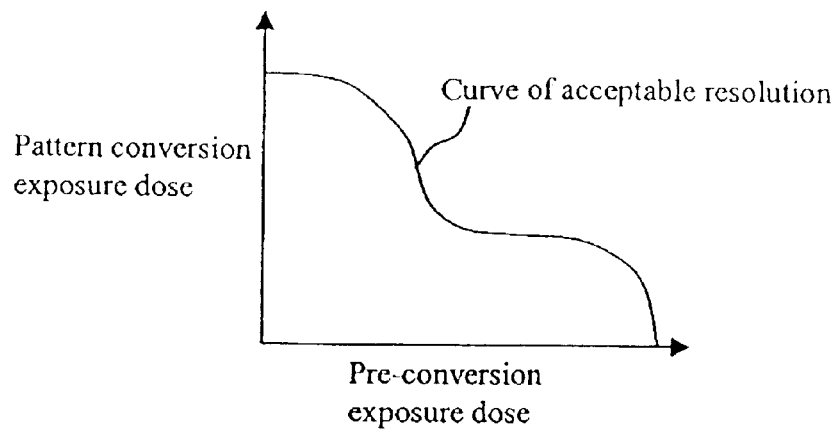
Figure 6a Relationship between pre-conversion exposure dose and acceptable pattern exposure dose
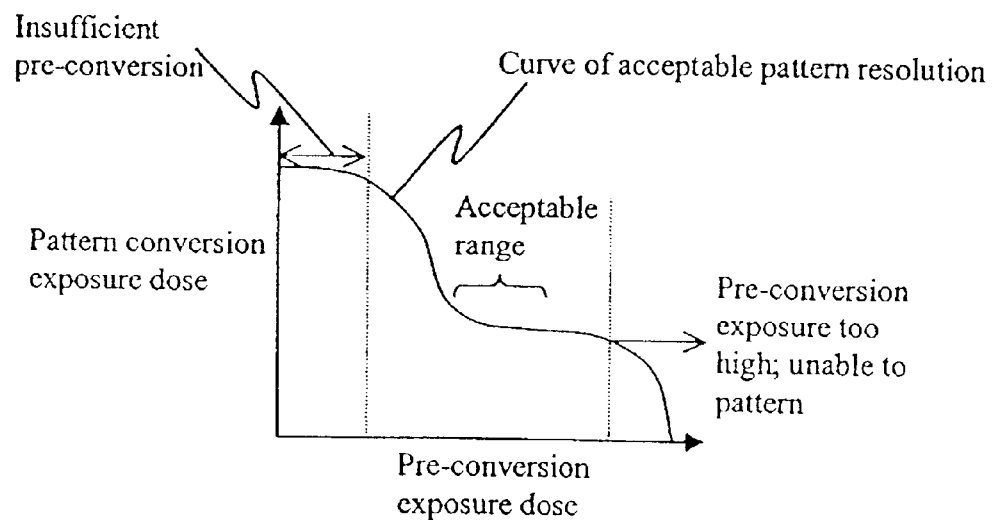
Figure 6b Ranges on curve of acceptable pattern resolution

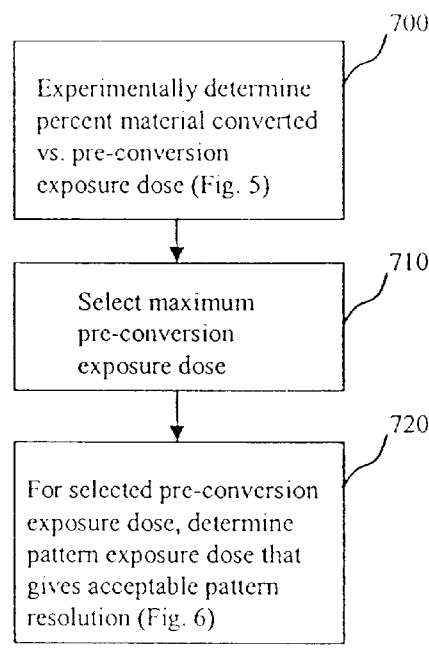
Figure 7. Method of selecting pre-conversion exposure dose and pattern exposure dose.

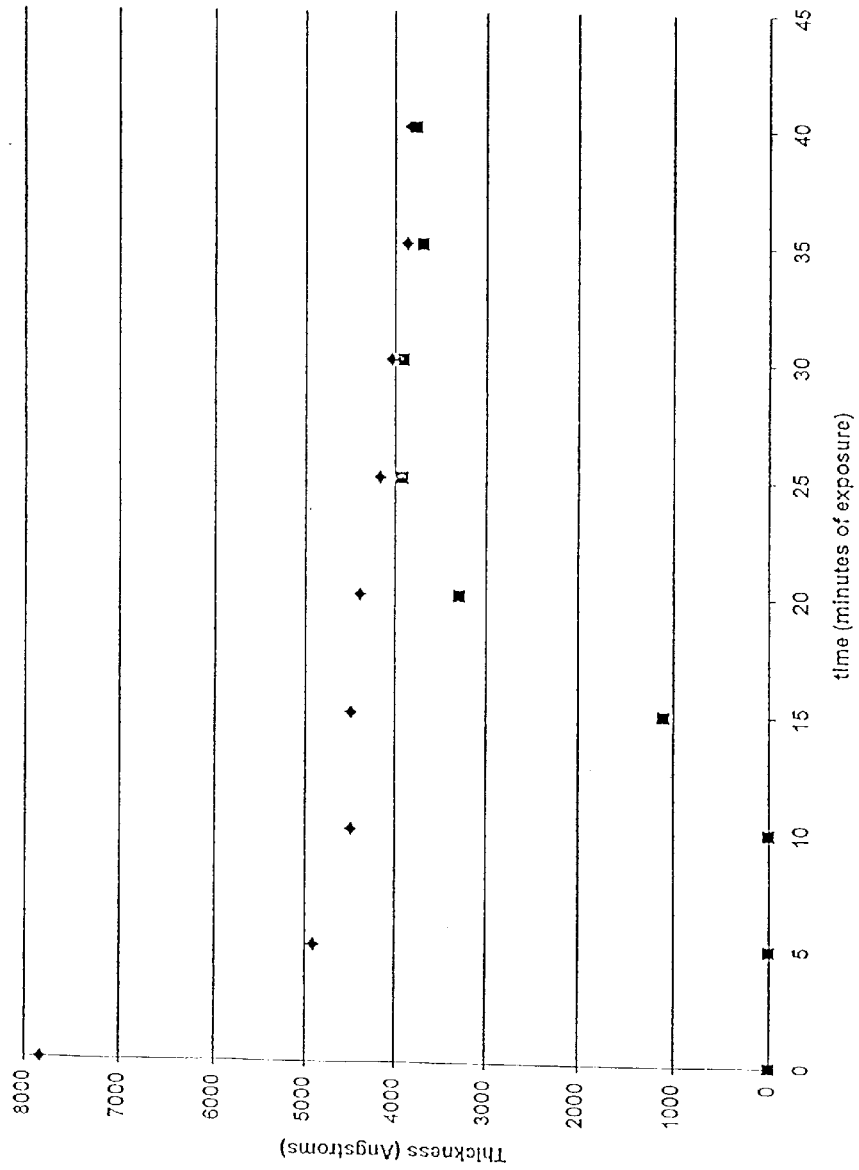

METHOD OF AND APPARATUS FOR SUBSTRATE PRE-TREATMENT

PRIORITY INFORMATION

This application is a utility application based on Provisional Ser. No. 60/209,947, filed Jun. 6, 2000.

FIELD OF THE INVENTION

The present invention relates generally to an apparatus and a method for patterning a precursor via a pre-conversion step.

BACKGROUND OF THE INVENTION

The semiconductor and packaging industries, among others, utilize processes to form thin metal and metal oxide films in their products. Conventional processes for forming metal and metal oxide films involve costly equipment and are time consuming. Examples of such processes include evaporation, sputter deposition, thermal oxidation and chemical vapor deposition. Evaporation is a process whereby a material to be deposited is heated near the substrate on which deposition is desired. Normally conducted under vacuum conditions, the material to be deposited volatilizes and subsequently condenses on the substrate, resulting in a blanket, or unpatterned, film of the desired material on the substrate. This method has several disadvantages, including the requirement to heat the desired film material to high temperatures and the need for high vacuum conditions. Unless a screen or shadow is employed during evaporation, an unpatterned, blanket film results from this process.

Sputtering is a technique similar to evaporation, in which the process of transferring the material for deposition into the vapor phase is assisted by bombarding that material with incident atoms of sufficient kinetic energy such that particles of the material are dislodged into the vapor phase and subsequently condense onto the substrate. Sputtering suffers from the same disadvantages as evaporation and, additionally, requires equipment and consumables capable of generating incident particles of sufficient kinetic energy to dislodge particles of the deposition material.

CVD is similar to evaporation and sputtering but further requires that the particles being deposited onto the substrate undergo a chemical reaction during the deposition process in order to form a film on the substrate. While the requirement for a chemical reaction distinguishes CVD from evaporation and sputtering, the CVD method still demands the use of sophisticated equipment and extreme conditions of temperature and pressure during film deposition.

Thermal oxidation also employs extreme conditions of temperature and an oxygen atmosphere. In this technique, a blanket layer of an oxidized film on a substrate is produced by oxidizing an unoxidized layer which had previously been deposited on the substrate.

Several existing film deposition methods may be undertaken under conditions of ambient temperature and pressure, including sol-gel and other spin-on methods. In these methods, a solution containing precursor particles that may be subsequently converted to the desired film composition is applied to the substrate. The application of this solution may be accomplished through spin-coating or spin-casting, where the substrate is rotated around an axis while the solution is dropped onto the middle of the substrate. After such application, the coated substrate is subjected to high temperatures which convert the precursor film into a film of the desired material. Thus, these methods do not allow for direct imaging to form patterns of the amorphous film. Instead, they result in blanket, unpatterned films of the desired material. These methods have less stringent equipment requirements than the vapor-phase methods, but still require the application of extreme temperatures to effect conversion of the deposited film to the desired material.

In one method of patterning blanket films, the blanket film is coated (conventionally by spin coating or other solution-based coating method; or by application of a photosensitive dry film) with a photosensitive coating. This photosensitive layer is selectively exposed to light of a specific wavelength through a mask. The remaining material may also then be used as a pattern transfer medium, or mask, to an etching medium that patterns the film of the desired material or as a circuit or dielectric layer. If used as a mask or etching, then this etch step, the remaining (formerly photosensitive) material is removed, and any by-products generated during the etching process are cleaned away if necessary.

In another method of forming patterned films on a substrate, a photosensitive material may be patterned as described above. Following patterning, a conformal blanket of the desired material may be deposited on top of the patterned (formerly photosensitive) material, and then the substrate with the patterned material and the blanket film of the desired material may be exposed to a treatment that attacks the formerly photosensitive material. This treatment removes the remaining formerly photosensitive material and with it portions of the blanket film of desired material on top. In this fashion a patterned film of the desired material results; no etching step is necessary in this "liftoff" process. It is also known that the "liftoff" method has severe limitations with regard to the resolution (minimum size) that may be determined by the pattern of the desired material.

In yet another method of forming patterned films, a blanket film of desired material may be deposited, e.g., by one of the methods described above, onto a substrate that has previously been patterned, e.g., by an etching process such as the one described previously. The blanket film is deposited in such a way that its thickness fills in and completely covers the existing pattern in the substrate. A portion of the blanket film is then isotropically removed until the remaining desired material and the top of the previously patterned substrate sit at the same height. Thus, the desired material exists in a pattern embedded in the previously patterned substrate. The isotropic removal of the desired material may be accomplished via an etching process; commonly in the case of the formation of semiconductor devices it is envisioned that this removal is effected through a process known as chemical mechanical planarization ("CMP"). This involves the use of a slurry of particles in conjunction with a chemical agent to remove substantial quantities of the desired material through a combination of chemical and mechanical action, leaving behind the desired material in the desired places embedded in the patterned substrate.

While some of these methods are more equipment-intensive than others and differ in the use of either solution- or vapor-phase methods, such conventional processes for forming metal and metal oxide films is not optimal because, for example, they each require costly equipment, are time consuming, require the use of high temperatures to achieve the desired result, and result in blanket, unpatterned films where, if patterning is needed, further patterning steps are required. Many of these methods suffer the additional disadvantage of, in many cases, forming polycrystalline films which may not be suitable for a variety of applications. A desirable alternative to these methods would be the use of a precursor material that may be applied to a substrate and selectively imaged and patterned to form an amorphous film without the need for undesirable intermediate steps.

One use of thin films in semiconductor processing is for the formation of thin top-surface imaging (hereafter "TSI") layers, typically atop organic layers that have already been applied to the substrate. In this instance, the organic layer need not be photoactive, since the thin film to be deposited will be subsequently patterned using conventional methods. The use of these thin films for TSI confers several process advantages, including resistance to plasma etching not afforded by the use of photoresist masks, and the increased resolution of the lithographic process afforded by a very thin film. Typical thin films for TSI include metal and silicon nitride and oxide films, and a great deal of research has also been conducted on a process known as silylation. This process involves the vapor deposition of a thin film of a silicon-containing species on top of a previously deposited organic layer. This thin film of the silicon species can then be imaged to form a thin film of silicon oxide, which acts as the TSI layer during oxygen-plasma patterning of the organic layer beneath. The acceptance of silylation processes by the semiconductor and packaging industries has been insignificant as a result of a number of process and cost limitations.

Another use of thin films in semiconductor processing is for the formation of hard masks, e.g., for use in ion implantation processing. Ion implantation is a well known technique used, for example, in forming doped regions in a substrate during semiconductor fabrication. Ion implantation frequently requires a patterned blocking layer, also known as a hard mask, which directs the ions to be implanted only into predetermined regions. For example, U.S. Pat. No. 5,436,176 to Shimizu et al. discloses, in "Embodiment 1", maskless implantation of a silicon substrate covered by a silicon oxide film, which is disclosed to be thrice-implanted with boron atoms. Alternatively, the same patent discloses, in "Embodiment 3", implantation using multiple hard masks in a thrice-repeated method comprising the following sequence of steps: forming a mask on a silicon substrate covered by a silicon oxide film, implantation with phosphorus, forming a second mask, implantation with boron, and, finally, annealing.

As previously discussed, formation of a hard mask by any of these processes requires a relatively large number of process steps. Eliminating some of these steps before etching or ion implantation would be beneficial because, for example, it could simplify the process used, increase its efficiency, and/or reduce its cost.

One approach to solve the problem involves the use of a photoresist as a mask. However, it is well known that photoresists have low etch resistance to certain plasma etching chemistries, particularly for the patterning of organic layers which may be employed as intermediate protecting layers or which are finding increasing use as low-dielectric constant (low-k) dielectrics, and low stopping power for ions. Therefore, undesirably thick photoresist films are required to permit complete etching of the layer to be patterned prior to complete erosion of the masking layer or to prevent implantation of the areas of the substrate onto which they are applied. Another disadvantage is that ion implants and photoresists can be exceedingly difficult to remove from wafers. Other solutions to the problem have been attempted, for example, by first applying a hard mask, then applying a photoresist layer atop the hard mask followed by patterning before etching or ion implantation take place. Combining some of the many steps disclosed in the prior art methods before plasma etching or ion implantation, or even eliminating one or more of them, would help simplify these processes. Thus, a method to eliminate steps in a plasma patterning or an ion implantation process would be highly desirable.

The photochemical processes for metal complex precursor deposition have been developed as less expensive methods of forming amorphous metal and metal oxide patterns. A precursor is at least partially converted to an amorphous metal or metal oxide layer by a partial converting means, e.g., light. As such, the present processes and, specifically, the photochemical metal organic deposition process, has utility in, e.g., the semiconductor and packaging industries.

The processes of the present invention can provide a patterned hard mask, thus replacing both the oxide and photoresist layers used in conventional TSI and ion implantation methods and, for example, simplifying those methods by reducing the number of processing steps which must be performed. Another advantage of this invention is that the material which is produced may have better etch resistance to plasma etching chemistries. This confers still another advantage to the present process that allows for the use of extremely thin films as the hard mask, increasing the ultimate resolution of the lithographic process and allowing the formation of smaller and finer features. A further advantage of this invention is that the material which is produced may have better ion implant blocking and stopping power. Additionally, the process of the present invention is advantageous in that it facilitates the use of new materials for patterned layers, such as platinum, iridium, iridium oxide, ruthenium, ruthenium oxide, and others that are known in the art to be difficult or impossible to etch by conventional processes.

At the current state of photochemical metal organic deposition technology, processing time is an issue. Exposure times are long and become longer as the thickness of the final film of converted precursor increases. Exposure times may reach one hour or more. In order to ensure widespread acceptance of the photochemical metal organic deposition technology, ways of reducing the processing time must be found, developed, and presented to the customers as part of a complete package.

The time required to process a layer of precursor is a barrier to high production efficiency in the photochemical metal organic deposition process. The patterning step in particular is a relatively slow step. What is needed is a way to reduce time required for patterning in the photochemical metal organic deposition process.

The following patents address conventional apparati for, and methods of, transferring wafers, pattern forming, and exposure techniques.

U.S. Pat. No. 5,140,366 describes an exposure apparatus for printing a pattern of a reticle on different shot areas of the wafer in a step-and-repeat manner. In the disclosed apparatus, an image of an alignment mark of the reticle is printed, by use of a projection lens system, on each of some shot areas of the wafer which are selected as the subject of detection. By this, a latent image of the reticle mark is formed on each of the selected shot areas. The latent image of the reticle mark is detected by a microscope which may be a phase contrast microscope and, from the results of detection concerning all the latent images of the reticle mark, a reference (correction) grid representing the coordinate positions of all the shot areas of the wafer is prepared and stored. In accordance with the stored reference grid, the stepwise movement of the wafer is controlled at the time of the step-and-repeat exposures of the wafer. This allegedly improves throughput of the apparatus. Further, use of the phase contrast microscope for the detection of the latent image of the reticle mark ensures further improvement in the alignment accuracy.

U.S. Pat. No. 4,770,590 describes a wafer transfer mechanism used for transferring wafers between cassettes and a boat that uses sensors to detect and to measure any offset of the actual center of each wafer being transferred with respect to the expected or precalibrated center of that wafer. An appropriate adjustment is made to effectively eliminate such offset so that each wafer can be transferred throughout the system without any edge contact between a wafer and the boat or the cassette. The system also includes a boat exchange unit having a rotatable turntable which is used in association with two boats. The boat exchange unit permits a continuous mode operation in which one boat can be undergoing a loading or unloading of wafers at one station on the turntable while another boat is at or is moving to or from a heating chamber loading or unloading station on the turntable.

U.S. Pat. No. 5,534,312 discloses a photoresist-free method for making a patterned, metal-containing material on a substrate which includes the steps of depositing an amorphous film of a metal complex on a surface of a substrate, placing the film in a selected atmosphere, and exposing selected areas of the film to electromagnetic radiation, preferably ultraviolet light and optionally through a mask, to cause the metal complex in the selected areas to undergo a photochemical reaction. However, this reference does not envision use of patterned, metal-containing material as a hard mask to protect underlying layers from a plasma etching environment.

U.S. Pat. No. 5,716,758 describes processes for forming fine patterns on a semiconductor substrate to a lesser degree than the resolving power of a step and repeat, thereby improving the degree of integration of the semiconductor device. The process comprises the steps of: forming a first light-exposure mask and a second light-exposure mask with interlaced patterns selected from a plurality of fine patterns to be formed on a semiconductor substrate; coating an organic material layer on the semiconductor substrate; patterning the organic material layer by use of the first light-exposure mask, to form organic material layer patterns; forming a photosensitive film over the organic material layer patterns; and patterning the photosensitive film by use of the second light-exposure mask to form photosensitive film patterns, in such a way that each of photosensitive film patterns is interposed between two adjacent organic material layer patterns.

U.S. Pat. No. 5,935,762 describes a new method for forming dual damascene patterns using a silylation process. A substrate is provided with a tri-layer of insulation formed thereon. A first layer of silylation photoresist is formed on the substrate and is imaged with a hole pattern by exposure through a mask. Using a silylation process, which greatly improves the depth of focus by reducing reflections from the underlying substrate, the regions in the first photoresist adjacent to the hole pattern are affixed to form top surface imaging mask. The hole pattern is then etched in the first photoresist. A second layer of photoresist is formed, and is imaged with a line pattern aligned with the previous hole pattern by exposure through a mask. The line pattern in the second photoresist is etched. The hole pattern in the first photoresist is transferred into the top layer of composite insulation first and then into the middle etch-stop layer by successive etching. The line pattern in the second photoresist layer is transferred into the first photoresist layer through a subsequent resist dry etching process. Finally, the line pattern and the hole pattern are transferred simultaneously into the top and lower layers of the composite insulation layer, respectively, through a final dry oxide etching. Having thus formed the integral hole and line patterns into the insulation layer, metal is deposited into the dual damascene pattern. Any excess metal on the surface of the insulating layer is then removed by any number of ways including chemical-mechanical polishing, thereby planarizing the surface and readying it for the next semiconductor process.

U.S. Pat. No. 5,989,759 describes a method where in the case of forming a fine pattern by exposure after exposure of a rough pattern, the exposure position of the rough pattern is adjusted, based on a latent image of the rough pattern, which has been subjected to exposure. As a result, a positional displacement between rough and fine patterns is reduced so that a desired pattern can be formed with high accuracy. To achieve down-sizing and improvements of throughputs, light exposure and charge beam exposure are sometimes used together. In case of performing exposure of a desired pattern in a plurality of stages, a positional displacement of each of exposure patterns in the stages leads to a decrease in exposure accuracy.

SUMMARY OF THE INVENTION

The present invention relates to a method of converting an organometallic precursor material to a metal-containing pattern adherent to a substrate, comprising: applying the organometallic precursor material in an amount sufficient to coat at least a portion of the substrate, wherein said organometallic precursor material is adapted to be converted to form a metal or metal oxide; pre-converting the organometallic precursor material by exposing the organometallic precursor material to a pre-conversion energy exposure dose such that the pre-converted precursor material is not converted to a degree sufficient to impair pattern resolution; pattern converting a portion of the pre-converted precursor material to convert this portion to a pattern-converted material to an extent sufficient to thereby form a pattern on the substrate; and either:

1) developing the portion of the pre-converted precursor material that was not pattern-converted such that the pattern remains on the substrate after developing; or alternately,
2) pattern converting a second portion of the pre-converted precursor material to convert this portion to a pattern-converted material an extent sufficient to thereby form a second pattern on the substrate; and developing the second portion of the pre-converted precursor material that was pattern-converted such that the second pattern remains on the substrate after developing.

In one embodiment, the pattern conversion comprises exposing the pre-converted precursor material to a patterning energy exposure dose, which converts the pre-converted precursor material to metal or metal oxide that adheres to the substrate to an extent sufficient to thereby form a deposited pattern thereon.

In another embodiment, the pre-conversion energy exposure dose is selected to be about 20% or less of, alternately from about 20% to about 50% of, the combination of the pre-conversion energy exposure dose and the patterning energy exposure dose, such that the pre-converted precursor material is substantially developable.

In yet another embodiment, the pre-conversion, the pattern-conversion, or both, comprises photochemical metal organic deposition. In still another embodiment, the pre-conversion comprises forming a metal or metal oxide within the organometallic precursor material.

In yet another embodiment, the pre-conversion energy exposure dose is selected to be from about 30% to about 80%, alternately from about 60% to about 99%, alternately about 50% or more, of a maximum pre-conversion energy exposure dose, wherein the maximum pre-conversion energy exposure dose is that energy dose above which the organometallic precursor material exposed to the pre-conversion energy exposure dose is no longer substantially developable or above which the organometallic precursor material exposed to the pre-conversion energy exposure dose adheres to the substrate to a degree sufficient to impair pattern resolution, wherein the organometallic precursor material exposed to the pre-conversion energy exposure dose is substantially developable.

The invention also relates to a substrate containing a patterned metal or metal oxide layer formed according to the invention.

In another embodiment, the pre-conversion comprises exposing the precursor material to a heat source, and wherein the pattern-conversion comprises exposing the pre-converted precursor material to a light source. In yet another embodiment, the pre-conversion comprises exposing the precursor material to a heat source, and wherein the pattern-conversion comprises exposing the pre-converted precursor material to an electron-beam source. In still another embodiment, the pre-conversion comprises exposing the precursor material to an electron-beam source, and wherein the pattern-conversion comprises exposing the pre-converted precursor material to a light source. In yet another embodiment, the pre-conversion comprises exposing the precursor material to a light source, and wherein the pattern-conversion comprises exposing the pre-converted precursor material to a light source.

The invention also relates to an apparatus for converting an organometallic precursor material to a metal-containing film adherent to a substrate formed by a method according to the above-described methods, comprising: a load station to store the substrate before processing; a means of delivering the substrate between processing steps; a pre-convert section, wherein the substrate is coated, if previously uncoated, with a sufficient amount of the organometallic precursor material and is subjected to a first converting means in either a series or parallel arrangement; a pattern convert section, wherein the organometallic precursor material coated on the substrate, subjected to a first converting means, and not covered by a mask is substantially converted, using a second converting means, to form a metal-containing pattern adherent to the substrate; and an unload station where the pattern-coated substrate is stored after processing. Advantageously, the first and second converting means are the same or different, and wherein each comprises a heat source, a light source, a coherent light source, a broadband light source, an electron beam source, or an ion beam source.

The invention also relates to a method of selecting a pre-conversion energy exposure dose and a patterning energy exposure dose to be used in converting an organometallic precursor material to a metal-containing patterned layer comprising at least two pattern elements that are adherent to a substrate, which method comprises: determining a relationship between the pre-conversion energy exposure dose in the conversion and the amount of pre-converted precursor material that adheres to the substrate; and selecting a pre-conversion energy exposure dose that is less than a maximum pre-conversion energy exposure dose, wherein the maximum pre-conversion energy exposure dose is that energy dose above which the organometallic precursor material exposed to the pre-conversion energy exposure dose is no longer substantially developable or above which the organometallic precursor material exposed to the pre-conversion energy exposure dose adheres to the substrate to a degree sufficient to impair pattern resolution, such that the patterning energy exposure dose yields an acceptable pattern resolution on the substrate, wherein the acceptable pattern resolution is such that the at least two elements of the metal-containing patterned layer are discrete and not connected by like material.

Advantageously, the method can further comprise identifying a maximum pre-conversion energy exposure dose based on the dose-conversion relationship, such that the organometallic precursor material exposed to the pre-conversion energy exposure dose, but not to the patterning energy exposure dose is substantially removable during developing. In one embodiment, the pre-conversion energy exposure dose is selected to be about 20% or less, or alternately from about 20% to about 50%, of the combination of the pre-conversion energy exposure dose and the patterning energy exposure dose, such that the pre-converted precursor material is substantially developable.

In another embodiment, the pre-conversion energy exposure dose is selected to be from about 30% to about 80%, alternately from about 60% to about 99%, alternately about 50% or more, of a maximum pre-conversion energy exposure dose, wherein the maximum pre-conversion energy exposure dose is that energy dose above which the organometallic precursor material exposed to the pre-conversion energy exposure dose is no longer substantially developable or above which the organometallic precursor material exposed to the pre-conversion energy exposure dose adheres to the substrate to a degree sufficient to impair pattern resolution, wherein the organometallic precursor material exposed to the pre-conversion energy exposure dose is substantially developable.

BRIEF DESCRIPTION OF THE DRAWINGS

FIG. 1 illustrates a basic sequence of a photochemical metal organic deposition process.

FIGS. 2 and 3 show two different varieties of a two-step conversion tool for conversion of precursor on a substrate.

FIG. 4 illustrates the method steps of a two-step conversion of precursor.

FIG. 5 illustrates the relationship between the pre-conversion exposure dose and the subsequent solubility of the pre-exposed film after development.

FIGS. 6a and 6b illustrate the relationship between pre-conversion exposure dose and pattern conversion exposure dose.

FIG. 7 illustrates the method steps of selecting pre-conversion exposure dose and pattern exposure dose to be used in the pre-convert section and the pattern convert section of the dual conversion tool.

FIG. 11 shows a combined thermal/photochemical contrast curve for a barium strontium titanate-forming precursor.

DETAILED DESCRIPTION OF THE PREFERRED EMBODIMENTS

Figure 8:
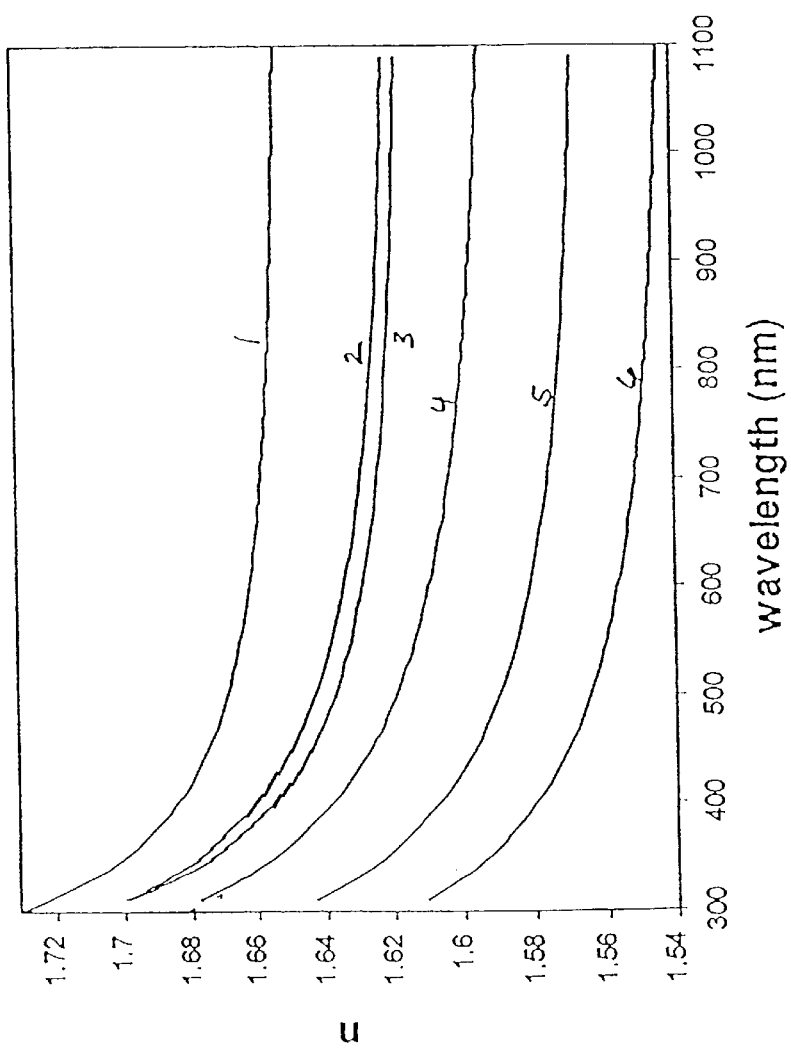
FIG. 8 illustrates the refractive indices of various $ZrO_2$ films formed by thermal and photochemical conversion.

The invention utilizes a pre-conversion step, which serves to pre-convert at least a portion of a precursor material by the application of a pre-conversion energy exposure dose. This pre-conversion energy exposure dose is less than the total exposure energy dose to which the precursor material is exposed. The pre-conversion energy exposure dose is beneficially an amount such that substantially no precursor that is not subjected to a subsequent conversion step adheres to the substrate during or after a subsequent developing step.

Current precursors require a significant amount of exposure energy, and therefore longer exposure time compared to photoresists. The invention relates to a photochemical metal organic deposition patterning process that is facilitated by a pre-conversion step. What is needed is a way to increase the throughput of the photochemical metal organic deposition patterning process by using a pre-conversion step.

The invention relates to a pre-conversion methodology and corresponding tool needs to be developed for pre-converting the precursor without requiring additional capital cost or slowing the production process. The invention also relates to an efficient pre-conversion methodology.

Total exposure energy dose must be distributed between pre-conversion dose and final conversion dose. A relationship between each portion of the total exposure dose and desired product characteristics is determined to optimize the time saving and achieve good pattern resolution. The invention relates to a method of determining the optimal division between time spent in pre-conversion and patterning (total conversion).

The present process allows for advantages unavailable with other film deposition and formation methods. As a result, it presents the user with a greater ability to control and manipulate the characteristics of the resulting film to suit the desired application. Therefore, the present process is useful in a broad spectrum of applications.

This invention provides a process for making patterned films of desired materials. It is important to recognize that amorphous films are distinct from polycrystalline and crystalline films; further, while amorphous films are distinct from more ordered films, in addition, different amorphous films formed by different film-forming methods are different from one another. Further still, the different properties of different amorphous films formed by different methods can be controlled and engender specific chemical, physical and mechanical properties that are useful in particular applications.

Photochemical metal organic deposition is a process that facilitates the formation of one or more metal-containing layers that are adherent to a substrate, generally beginning with an organometallic precursor material. However, any suitable method for converting an organometallic precursor material ultimately into a metal-containing layer that is sufficiently adherent to a substrate and/or that is substantially not developable may be used. Organometallic precursor materials, which are defined herein to contain organometallic-ligand moieties or coordination complexes of ligands with one or more metals, can be synthesized by any known means and may also include a solvent or solvent mixture to facilitate delivery to the substrate. Subsequent steps may be undertaken to form a metal-containing film that is adherent to the substrate. These subsequent steps may include some or all of the following: spin or spray application to the substrate, pre-conversion treatment, conversion, post-conversion treatment, developing, and post-development treatment. Specific steps chosen can depend upon the ultimate end-use of the product. A method of using photochemical metal organic deposition is given, e.g., in U.S. Pat. No. 5,534,312, which describes a method for directly depositing metal containing patterned films, and the entire disclosure of which is hereby incorporated by express reference hereto.

Where a patterned film is desired, the process described here may proceed photochemically, without the use of an intermediate patterning material, e.g., a photoresist, and may be undertaken under ambient conditions, or may be undertaken under other conditions such as either an air or other composition atmosphere and/or under a variety of pressures, e.g., ambient, higher or lower than ambient, and may be used in conjunction with a variety of other processing steps to yield unique materials.

Where the process is performed photolytically, the process proceeds at substantially ambient temperatures while other prior art methods require the use of elevated temperatures to effect pattern transfer, often greater than about 100° C. This limitation confers severe processing constraints from a manufacturing standpoint and limits the choice of materials used in the assembly of devices associated with the applications of the method.

The process of the present invention usually proceeds satisfactorily under substantially ambient pressure. In contrast, many of the prior art deposition methods, in addition to having the aforementioned limitations, must be undertaken under conditions of high vacuum, invoking the necessity for expensive and complicated equipment that is difficult to run and maintain.

The processes of the present invention facilitate the formation of a thin layer on a substrate from a precursor material, preferably an organometallic precursor material. The precursor material comprises molecules specifically designed for their ability to coat the substrate in a uniform manner, resulting in films of high optical quality, and, in the case of the present process, for photosensitivity. The identity of the precursor molecule is a significant variable—a wide variety of metal complexes of the formula $M_aL_b$ comprising at least one metal ("M"), i.e., a is an integer which is at least 1, and at least one suitable ligand ("L") or ligands, i.e., b is an integer which is at least 1, are envisioned by this invention.

If a plurality of metals are used, all of the metal atoms may be identical, all may be different atoms and/or have different valences, e.g., Ba Na or Fe(II) Fe(III), or some may be identical while others may be different atoms and/or have different valences, e.g., $Ba_2$ Fe(II) Fe(III). In any case, metal M may be an alkali or alkaline earth, for example Ba or Li, a transition metal, for example Cr or Ni, a main group metal, for example Al or Sn, or an actinide, for example U or Th. Preferably, each metal is independently selected from Li, Al, Si, S (when it has a +6 oxidation state), Ti, V, Cr, Mn, Fe, Ni, Co, Cu, Zn, Sr, Y, Zr, Nb, Mo, Ru, Rh, Pd, Ag, In, Sn, Ba, La, Pr, Sm, Eu, Hf, Ta, W, Re, Os, Ir, Pt, Au, Pb, Th, U, Sb, As, Ce, and Mg.

If a plurality of ligands are used, all of the ligands may be identical, all may be different, or some may be identical while others may be different. In any case, ligand L is chosen so that a substantially unconverted precursor complex can be formed and has the properties that:

1) it can be converted into a form such that an adherent layer is deposited on a substrate,
2) the complex is stable or, at least, metastable,
3) upon absorbing energy, e.g., one or more photons of the required energy, the complex can be transformed into a different metal-containing moiety through a chemical reaction, and 4) any byproducts of the energy-induced chemical reaction should be removable, i.e., should be sufficiently chemically volatile or mechanically labile so as to be removable.

To achieve the first two of these results, the complex should generally have a low polarity and low intermolecular forces. As organic groups usually have low intermolecular forces, ligands having organic groups at their outer peripheries tend to be satisfactory with respect to the first two requirements. If the energy absorbed is light, the chemical reaction of step (3) is known as a photo-induced reaction.

The deposited film of substantially unconverted precursor is amorphous or at least substantially amorphous. Therefore, to make the metal complex resistant to crystallization, ligand(s) L preferably are such that the complex is asymmetric. The complex may be made asymmetric by using a ligand which itself has two or more stereoisomeric forms. For example, if L is racemic 2-ethylhexanoate, the resulting metal complex is asymmetric because the complex has several different stereoisomeric forms. The size and shapes of organic portions of the ligands may be selected to optimize film stability and to adjust the thickness of film that will be deposited by the selected film deposition process.

The stability of an amorphous film with respect to crystallization may also be enhanced by making the film of a complex which has several different ligands attached to each metal atom. Such metal complexes have several isomeric forms. For example, the reaction of $CH_3HNCH_2CH_2NHCH_3$ with a mixture of a nickel(II) salt and KNCS leads to the production of a mixture of isomers. The chemical properties of the different isomers are known not to differ significantly, however, the presence of several isomers in the film impairs crystallization of the complex in the film.

The complex must also be stable, or at least metastable, in the sense that it will not rapidly and spontaneously decompose under process conditions. The stability of complexes of a given metal may depend, for example, upon the oxidation state of the metal in the complex. For instance, Ni(0) complexes are known to be unstable in air while Ni(II) complexes are air-stable. Consequently, a process for depositing Ni based films which includes processing steps in an air atmosphere should include a Ni(II) complex in preference to a Ni(0) complex.

Partial conversion and conversion result from a chemical reaction within the film which changes the partially converted or converted regions into a desired converted material. Ideally, at least one ligand should be reactive and be attached to the complex by a bond which is cleaved when the complex is raised to an excited state by the influence of the partial converting means and/or the converting means. Preferably the reactive group is severed from the complex in a photochemical reaction initiated by light, more preferably, by ultraviolet light, as the partial converting means and/or the converting means. To make such photochemical step(s) in the process efficient, it is highly preferable that the intermediate product produced when the reactive group is severed be unstable and spontaneously convert to the desired new material and volatile byproduct(s).

There are several mechanisms by which a suitable photochemical reaction may occur. Some examples of suitable reaction mechanisms which may be operable, individually or in combination, according to the invention are as follows: (a) absorption of a photon may place the complex in a ligand to metal charge transfer excited state in which a metal-to-ligand bond in the metal complex is unstable, the bond breaks and the remaining parts of the complex spontaneously decompose, (b) absorption of a photon may place the complex in a metal-to-ligand charge transfer excited state in which a metal-to-ligand bond in the complex is unstable, the bond breaks and the remaining parts of the complex spontaneously decompose, (c) absorption of a photon may place the complex in a d—d excited state in which a metal-to-ligand bond in the complex is unstable, the bond breaks and the remaining parts of the complex spontaneously decompose, (d) absorption of a photon may place the complex in an intramolecular charge transfer excited state in which a metal-to-ligand bond in the complex is unstable, the bond breaks and the remaining parts of the complex spontaneously decompose, (e) absorption of a photon may place at least one ligand of the complex in a localized ligand excited state, a bond between the excited ligand and the complex is unstable, the bond breaks and the remaining parts of the complex spontaneously decompose, (f) absorption of a photon may place the complex in an intramolecular charge transfer excited state such that at least one ligand of the complex is unstable and decomposes, then the remaining parts of the complex are unstable and spontaneously decompose, (g) absorption of a photon may place at least one ligand of the complex in a localized ligand excited state wherein the excited ligand is unstable and decomposes, then the remaining parts of the complex are unstable and spontaneously decompose, and (h) absorption of a photon may place the complex in a metal-to-ligand charge transfer excited state in which at least one ligand of the complex is unstable and decomposes, then the remaining parts of the complex are unstable and spontaneously decompose. In its broad aspects, however, this invention is not to be construed to be limited to these reaction mechanisms.

More preferably, the ligands are selected from the group consisting of acetylacetonate (also known as "acac" or 2,4-pentanedione) and its anions, substituted acetylacetonate, i.e.,

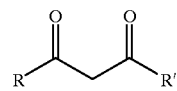

and their anions, acetonylacetone (also known as 2,5-hexanedione) and its anions, substituted acetonylacetone, i.e.,

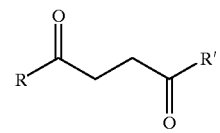

and its anions, dialkyldithiocarbamates, i.e.,

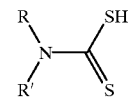

and its anions, carboxylic acids, i.e.,

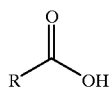

such as hexanoic acid where $R=CH_3(CH_2)_4$, carboxylates, i.e.,

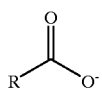

such as hexanoate where $R=CH_3(CH_2)_4$, pyridine and/or substituted pyridines, i.e.,

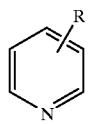

azide, i.e., $N_3^-$, amines, e.g., $RNH_2$, diamines, e.g., $H_2NRNH_2$, arsines, i.e.,

diarsines, i.e.,

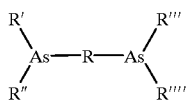

phosphines, i.e.,

diphosphines, i.e.,

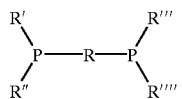

arenes, i.e.,

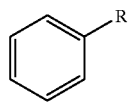

hydroxy, i.e., $OH^-$, alkoxy ligands, e.g., $RO^-$, ligands such as $(C_2H_5)_2NCH_2CH_2O-$, alkyl ligands, e.g., $R^-$, aryl ligands, and mixtures thereof, where each R, R', R", R''', and R'''' is independently selected from organic groups and, preferably, is independently selected from alkyl, alkenyl, aralkyl and aralkenyl groups.

As used herein, the term "alkyl" refers to a straight or branched hydrocarbon chain. As used herein, the phrase straight chain or branched chain hydrocarbon chain means any substituted or unsubstituted acyclic carbon-containing compounds, including alkanes, alkenes and alkynes. Examples of alkyl groups include lower alkyl, for example, methyl, ethyl, n-propyl, iso-propyl, n-butyl, iso-butyl, tert-butyl or iso-hexyl; upper alkyl, for example, n-heptyl, -octyl, iso-octyl, nonyl, decyl, and the like; lower alkylene, for example, ethylene, propylene, propylyne, butylene, butadiene, pentene, n-hexene or iso-hexene; and upper alkylene, for example, n-heptene, n-octene, iso-octene, nonene, decene and the like. The ordinary skilled artisan is familiar with numerous straight, i.e., linear, and branched alkyl groups, which are within the scope of the present invention. In addition, such alkyl groups may also contain various substituents in which one or more hydrogen atoms is replaced by a functional group or an in-chain functional group.

As used herein, the term "alkenyl" refers to a straight or branched hydrocarbon chain where at least one of the carbon—carbon linkages is a carbon—carbon double bond. As used herein, the term "aralkyl" refers to an alkyl group which is terminally substituted with at least one aryl group, e.g., benzyl. As used herein, the term "aralkenyl" refers to an alkenyl group which is terminally substituted with at least one aryl group. As used herein, the term "aryl" refers to a hydrocarbon ring bearing a system of conjugated double bonds, often comprising at least six π (pi) electrons. Examples of aryl groups include, but are not limited to, phenyl, naphthyl, anisyl, toluyl, xylenyl and the like.

The term "functional group" in the context of the present invention broadly refers to a moiety possessing in-chain, pendant and/or terminal functionality, as understood by those persons of ordinary skill in the relevant art. As examples of in-chain functional groups may be mentioned ethers, esters, amides, urethanes and their thio-derivatives, i.e., where at least one oxygen atom is replaced by a sulfur atom. As examples of pendant and/or terminal functional groups may be mentioned hydrogen-containing groups such as hydroxyl, amino, carboxyl, thio and amido, isocyanato, cyano, epoxy, and ethylenically unsaturated groups such as allyl, acryloyl and methacryloyl, and maleate and male-imido.

To enhance the desired photochemical characteristics, including the tendency of the products of the photochemical reaction to spontaneously thermally decompose, ligands comprising and/or selected from one or more of the following groups may be used alone or in combination with the above-listed ligands: oxo, i.e., $$O_2^-$$

oxalato, i.e.,

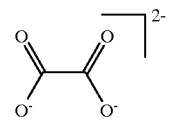

halide, hydrogen, hydride, i.e., $H^-$, dihydride, i.e., $H_2$, hydroxy, cyano, i.e., $CN^-$, carbonyl, nitro, i.e., $NO_2$, nitrito, i.e., $NO_2^-$, nitrate, i.e, $NO_3$, nitrato, i.e., $NO_3^-$, nitrosyl, i.e., NO, ethylene, acetylenes, i.e., $$R \equiv R'$$

thiocyanato, i.e., $SCN^-$, isothiocyanato, i.e., $NCS^-$, aquo, i.e., $H_2O$, azides, carbonate, i.e., $CO_3^{-2}$, amine, and thiocarbonyl, where each R and R' is independently selected from organic groups and, preferably, is independently selected from alkyl, alkenyl, aralkyl and aralkenyl groups. Even more preferably, each ligand is independently selected from acac, carboxylates, alkoxy, oxalato, azide, carbonyl, nitro, nitrato, amine, halogen and their anions.

Preferably, the metal complex precursor is selected from those comprising acac, carboxylato, alkoxy, azide, carbonyl, nitrato, amine, halide and nitro complexes of Li, Al, Si, Ti, V, Cr, Mn, Fe, Ni, Co, Cu, Zn, Sr, Y, Zr, Nb, Mo, Ru, Rh, Pd, Ag, In, Sn, Ba, La, Pr, Sm, Eu, Hf, Ta, W, Re, Os, Ir, Pt, Au, Pb, Th, U, Sb, As, Ce, Mg, and mixtures thereof The precursor may be applied to the substrate directly. Alternatively and preferably, the precursor is dissolved in a solvent or solvents to form a precursor solution. This facilitates its application to the substrate by a variety of means well known to those of ordinary skill in the art, such as by spin or spray application of the solution to the substrate. The solvent may be chosen based on several criteria, individually or in combination, including the ability of the solvent to dissolve the precursor, the inertness of the solvent relative to the precursor, the viscosity of the solvent, the solubility of oxygen or other ambient or other gases in the solvent, the UV, visible, and/or infrared absorption spectra of the solvent, the absorption cross-section of the solvent with respect to electron and/or ion beams, the volatility of the solvent, the ability of the solvent to diffuse through a subsequently formed film, the purity of the solvent with respect to the presence of different solvent isomers, the purity of the solvent with respect to the presence of metal ions, the thermal stability of the solvent, the ability of the solvent to influence defect or nucleation sites in a subsequently formed film, and environmental considerations concerning the solvent. Exemplary solvents include the alkanes, such as hexanes, the ketones, such as methyl isobutyl ketone ("MIBK") and methyl ethyl ketone ("MEK"), and propylene glycol monomethyl ether acetate ("PGMEA").

The concentration of the precursor in the solution may be varied over a wide range and may be chosen by one of ordinary skill in the art with, at most, minimal routine experimentation, such that the properties of the precursor film, including its thickness and/or sensitivity to irradiation by light or particle beams, are appropriate for the desired application.

To the extent that metal atoms in the patterned layer or film formed by a method according to the invention might be "bumped" into the underlying substrate during a subsequent step, this can be overcome by careful selection of precursor formulation conditions and/or thickness. Alternatively, an optional protective layer can be used between the substrate and the precursor layer which remains to protect the substrate after the patterned layer forming process is completed. Optionally, the substrate may be coated with at least one protective layer before the precursor or precursor solution is applied. The protective layer may be applied to the substrate by a variety of means well known to those of ordinary skill in the art. Protective layers are particularly desirable when the process includes an ion implantation step.

The preparation of the substrate prior to deposition of the precursor film can have a significant impact on the ultimate nature of the desired patterned layer. Thus, certain surface preparations may be desirable or, conversely, may need to be avoided depending upon the particular patterned layer used. Substrate preparations may include a simple cleaning process to remove unwanted species from the substrate surface, a prior patterning step, the deposition of a barrier material, the deposition of an adhesion promoting material, or the deposition of a reactive material designed to induce chemical change in the film of deposited material, e.g., a coupling agent.

The method of application of the precursor or the precursor solution may be chosen depending on the substrate and the intended application. Some examples of useful coating methods well known to those of ordinary skill in the art include spin, spray, dip and roller coating, stamping, meniscus, and various inking approaches, e.g., inkjet-type approaches. Variables in the coating process may be chosen in order to control the thickness and uniformity of the deposited film, to minimize edge effects and the formation of voids or pinholes in the film, and to ensure that no more than the required volume of precursor or precursor solution is consumed during the coating process. Optimized application of the precursor film may desirably yield very smooth films.

The deposited film may, optionally, be subjected to a baking or vacuum step where any residual solvent present in the deposited film may be driven off. If a baking step is employed, it is, of course, important to keep the temperature of this step below the temperature at which the precursor molecules decompose thermolytically. The process of the invention allows for blanket thermal or heat treatment or annealing of the precursor cast film so as to convert it thermolytically into a blanket uniform coating of the desired material, or to a film that requires a lower partial converting means and/or converting means dose for patterning than would have been possible without the thermal treatment. The deposited film may optionally be subjected to other treatments at this stage of the process, including but not limited to blanket photochemical or electron beam exposure and microwave treatment.

Typically, baking off solvent does not initiate pre-conversion. It is recognized, however, that a bake step during the process may contribute to ejecting solvent from the precursor film and also initiate a thermal decomposition process. Both of these mechanisms may aid in the overall efficiency of the process resulting in, for example, a lower dose requirement during a subsequent converting step. It is further recognized that during such a bake step, a new pre-converted material, different from either the deposited film or the film of the desired material, may be formed. The effect of this could alter subsequent properties of the desired material, including dielectric constant, nucleation, speciation, and crystallization behavior in ways that are not readily predicted by one skilled in the art. For example, a two component system in which one material is activated in the pre-bake step while the other component(s) is selected to be activated in either a photochemical or higher energy thermal process step may be preferred in certain applications. This deposition, from a mixture of precursors, would permit the efficient design of a system to take advantage of the different chemical properties of materials formed from the bake and subsequent partial converting and/or converting step(s).

The deposited film is subjected to a pre-conversion step including a partial converting means and/or converting means, i.e., a source of energy, such that the precursor is at least partially converted. The entire film, or selected regions of the deposited precursor film, may be exposed to a source of energy. The energy source may be, e.g., a heat source, a light source of a specific wavelength, a coherent light source of a specific wavelength or wavelengths, a broadband light source, an electron beam ("e-beam") source, or an ion beam source, or a combination thereof. Light in the wavelength range of from about 150 to about 600 nm is suitably used. Preferably, the wavelength of the light is from about 157 to about 436 nm.

In certain embodiments of the invention, the energy source is a light source directed through an optical mask used to define an image on the surface. The mask consists of substantially transparent and substantially opaque or light absorbing regions. The mask may also include an optical enhancing feature such as a phase shift technology. The mask typically has opaque regions and transparent regions, relative to the patterning light, so that only portions of the photosensitive layer are exposed, from which a pattern is formed. The exposure can change the solubility and/or composition of the exposed areas of the photosensitive layer in such a manner that either the exposed or unexposed areas may be selectively removed by use of a developing solution. The remaining material can consist essentially of: organic material, in a first embodiment; dielectric material, in a second embodiment; and metal and/or metal oxide, in a third embodiment. However, the energy source need not be directed through a mask. For example, if it is not necessary to pattern the material, a flood or blanket energy exposure may be used, such as is provided by thermal energy or a wide beam of light.

The atmosphere and pressure, both total and partial, under which the deposited film is at least partially converted may be important process variables. Normally, it is convenient and economical for the atmosphere to be air but it may be preferable to change the composition of the atmosphere present during at least partial conversion. One reason for this is to increase the transmission of the exposing light, if short wavelength light is used, because such light may be attenuated by air. Similarly, electron-beam radiation may be impaired by the presence of certain gases. It may also be desirable to change the composition of the atmosphere to alter the composition or properties of the product film. For example, the exposure of a copper complex results in the formation of a copper oxide in air or oxygen atmospheres. By virtually eliminating oxygen from the atmosphere, a film comprising primarily reduced copper species may be formed. For example, a partial conversion or conversion step is preferably performed in the presence of oxygen if the converted precursor is to be a dielectric film or in the presence of a reducing gas, such as hydrogen, if the converted precursor is to be a metallic film. Additionally, the amount of water in the film may be changed by changing the humidity of the atmosphere. By increasing the intensity of the light, it is possible to initiate thermal reaction within the films to generate product films.

The use of a partial conversion step, or different partial conversion steps in sequence, also known as "substrate pretreatment," may be advantageous from a process flow standpoint, for example, in order to minimize the time during which a precursor atop a substrate needs to be exposed in an expensive piece of equipment, such as a stepper or masked light. Substrate pretreatment is preferred in methods according to the present invention.

After the precursor has been pre-converted, a portion of the precursor film is next optionally but typically subjected to a converting means such that the desired portion(s) of the precursor is(are) substantially converted. The entire film or selected regions of the precursor film may be exposed to a source of energy. Preferably, the methods according to the present invention include substantially converting only a portion of the precursor material, generally in the shape of a predetermined pattern, which may be outlined by an external mask. In this preferred embodiment, the remaining portion of the precursor material should generally remain partially converted such that the pattern resolution is not impaired. Optionally but preferably, the remaining portion of the precursor material should be substantially developable, while the substantially converted portion of the precursor material, referred to herein as the pattern-converted material, should be substantially undevelopable and/or sufficiently adherent to the substrate.

In one embodiment, unconverted and/or partially converted precursor is/are removed during development. In another embodiment, the developing material is selected so that unconverted and/or partially converted precursor material is/are not removed during the development, but the pattern-converted precursor material is removed during development.

The converting means can be an energy source that may be the same as or different from any partial converting means previously employed. For example, the converting means may be a light source of a specific wavelength, a coherent light source of a specific wavelength, a broadband light source, an electron beam source, or an ion beam source. In certain embodiments of the invention, the energy source is a light source directed through an optical mask used to define an image on the surface, as discussed above. However, the energy source need not be directed through a mask. For example, it may not be necessary to pattern the material during the conversion step, e.g., because the precursor may already be patterned, therefore, a flood or blanket exposure may be used as the converting means. Preferred converting means include light, electron beam, ion beam, and thermal treatment. As discussed above for partial conversion and as is also applicable here, the atmospheric conditions under which the deposited film is converted, such as atmosphere composition, pressure, both total and partial, and humidity, may be important process variables. During conversion, these variables may be the same as or different from their settings used in any preceding partial conversion step.

Following substantial conversion of a portion of the precursor into a patterned layer or film, the precursor film may, optionally, be treated by any of a variety of methods well known to the art prior to removing at least a portion of the unconverted precursor layer. These methods include but are not limited to annealing treatments, such as thermal, laser or plasma annealing steps, exposure to a specific atmosphere, e.g., oxidizing or reducing, ion implantation, microwave treatment and electron beam treatment. If the at least partial converted area(s) may serve as electroless plating nucleation sites relative to the unconverted area(s) of the precursor, then an optional plating step may be used at this stage.

Unexposed or insufficiently converted or adherent regions of the precursor layer, or portions thereof, may then be removed by the application of a removing (or developing) means. For example, a developing means may comprise a developer composition that may be applied as a liquid or a solution in a puddle development or immersion wet development process. Alternately, a dry development process analogous to dry patterning steps conventionally employed by the semiconductor industry may be employed as a developing means. Preferred removal means include spray development, puddle development, and immersion wet development.

The developer should typically be formulated and/or used under conditions such that a solubility difference exists between exposed and unexposed regions of the film. This solubility difference is used to remove preferentially select regions of the film such that certain chosen regions of the film are substantially removed by the developer while regions desired to remain on the substrate are left substantially intact. The precursor and developer are selected so that either of the pre-converted or the pattern-converted precursor materials is removed during development. Considerable experimentation may be required to optimize the formulation of the developer. For example, in a process in which regions that have been exposed to incident energy are desired to remain on the substrate, use of the casting solvent to develop the film after exposure to incident radiation is too aggressive. A dilute solution of the casting solvent in another liquid in which (a) the casting solvent is miscible, (b) unexposed regions of the film are sparingly (but not necessarily completely) soluble, and (c) exposed regions of the film are substantially insoluble, provides for an improved development process.

After development, the at least partially converted precursor may, optionally, be treated by any of a variety of methods well known to the art prior to its being subjected to a converting means. These methods include but are not limited to annealing treatments, such as thermal, laser or plasma annealing. The temperature and time of such annealing are important variables. The annealing step may also be influenced by prior surface treatments, for example, oxygen plasma, laser or a rapid thermal annealing ("RTA") process. It is possible to select appropriate conditions such that the annealed at least partially converted precursor retains its amorphous nature while at least one of its physical or electrical properties is desirably altered. Alternatively, annealing conditions that cause the film to convert to its crystalline state, e.g., a high temperature, may be desirable depending on the application for which the film is to be used. For example, appropriate thermal treatment at this stage may be employed to induce the formation of highly oriented crystalline films from the amorphous at least partially converted precursor. In this manner, the properties of the amorphous film may be finely tuned or its physical properties may even be varied over a wide range—from the completely amorphous phase at one extreme to semi-crystalline intermediate phases to a single oriented crystalline phase at the other extreme.

After conversion, subsequent optional process steps may include post-conversion treatment, developing, including but not limited to the novel development method discussed above, and post-developing treatment steps. The specific steps chosen depend upon the ultimate use of the product. For example, methods of use are described in U.S. Pat. Nos. 5,534,312, 5,821,017 and 6,071,676, each of which is incorporated herein by reference in its entirety.

In certain embodiments of the present process, conversion is followed by an implantation step, where at least one implanted region is formed in the substrate by using an implantation means on at least a portion of the substrate substantially uncovered by the patterned layer. The use of an ion beam as an implantation means is well known to the art. However, the present process is not limited to the use of ion beams; any effective method of implantation may be used. Ions suitable for implantation include but are not limited to arsenic, boron and phosphorous. Ion implantation may be conducted under conditions of high energy, i.e., greater than about 300 KeV, coupled with low dose, i.e., less than about $10^{20}$ atm/cm$^2$, or under conditions of low energy, i.e., less than about 300 KeV, coupled with high dose, i.e., greater than about $10^{20}$ atm/cm$^2$. Optionally, the patterned layer may be removed after implantation. Optionally, the implanted substrate may be further treated, such as by annealing, thereby converting implanted substrate regions into doped regions. If both of these optional steps are performed, the order in which they are performed may be adjusted to suit the particular application to which the present invention is directed.

Another aspect of the present invention relates to an apparatus for two-step conversion of an organometallic precursor material to a metal-containing film adherent to a substrate, containing: a load station to store the substrate before processing; a means of delivering the substrate between processing steps; a pre-convert section, wherein the substrate is coated, if previously uncoated, with a sufficient amount of the organometallic precursor material and is subjected to a first converting means in either a series or parallel arrangement; a pattern convert section, wherein the organometallic precursor material coated on the substrate, subjected to a first converting means, and not covered by a mask is substantially converted, using a second converting means, to form a metal-containing pattern adherent to the substrate; and an unload station where the pattern-coated substrate is stored after processing. The first and second converting means may be the same of different, and each encompasses an energy source, which may include light, UV, thermal, e-beam, or plasma sources.

Another aspect of the present invention involves a method of selecting a pre-conversion exposure dose and a pattern exposure dose to be used in a two-step conversion of precursor on a substrate via a photochemical metal organic deposition process, and includes the steps of: experimentally determining percent material converted vs. pre-conversion exposure dose; selecting a maximum pre-conversion exposure dose; and determining the pattern exposure dose that gives acceptable pattern resolution.

Although the present invention may require preparatory work to experimentally develop necessary curves to determine the proper balance of pre-exposure dose and pattern exposure dose, the benefits realized after the initial preparatory work, however, outweigh the cost and inconvenience of developing the curves. In addition, the present invention enhances the marketability of current precursor material, without requiring new processing tools. The cost saving achieved by eliminating the process steps not required by the photochemical metal organic deposition process, therefore, can be maintained.

FIG. 1 illustrates a basic sequence of Photochemical metal organic deposition process steps in steps 1A, 1B, 1C, and 1D, conducted on a substrate 10 (shown in step 1A of FIG. 1 prior to photochemical metal organic deposition processing). Substrate 10 may be a silicon wafer, or may be another material such as a printed circuit board or a ceramic substrate. In step 1B, a precursor 11 is applied to a substrate 10. In step 1C, light or heat energy is applied to create a converted precursor 12 from a selected portion of precursor 11. In step ID, developer is applied to remove unconverted precursor 11 and leave the converted precursor 12 intact.

The present invention involves an apparatus for undertaking, and method of using, a pre-conversion step in the photochemical metal organic deposition process. The pre-conversion step (partial conversion prior to patterning) can advantageously be performed to reduce the exposure time required while still achieving an acceptable image pattern on the substrate.

FIG. 2 shows a two-step conversion tool 100 for conversion of precursor on a substrate, which includes a load station 105, a pre-convert section 110, a pattern convert section 115, and an unload station 120. A first substrate carrier 125, located at load station 105, delivers a substrate 130 to an airtrack 135 from a stack of substrates stored in first substrate carrier 125. The airtrack 135 delivers a substrate 130 to one of three (in this example) identical and parallel sub-sections in pre-convert section 110. Pre-convert section 110 includes a first hotplate 140 under a first lamp 142, a second hotplate 150 under a second lamp 152 and a third hotplate 160 under a third lamp 162. Substrates 130 are exposed to light, heat, or both energy forms at these locations, and then delivered to pattern convert section 115 via airtrack 135. The number of pre-convert subsections is chosen to match the ratio between pre-conversion exposure and pattern exposure. In the present example the pre-conversion exposure takes three times as long as the pattern expose, so a first substrate from first hotplate 140 would be moved to an alignment stage 165 and backfilled by a substrate 130 from first substrate carrier 125. After the first substrate is patterned and moved to second substrate carrier 125, a second substrate 130 is moved from second hotplate 150 to alignment stage 165 and back-filled by another substrate 130 from first substrate carrier 125. This movement continues until all substrates 130 have been through one sub-section of pre-convert section 110 and pattern convert section 115. The flow of substrates from the sub-sections of pre-convert section 110 to pattern convert section 115 is continuous. Once substrate 130 arrives at pattern convert section 115, it is positioned on alignment stage 165 and subjected to energy emanating from high intensity lamp 170. The light energy from high intensity lamp 170 is directed through a mask 175 and optics 180 to strike substrate 130. As a result, substrate 130 is patterned with the shape of mask 175. Substrate 130 then proceeds via airtrack 135 to unload station 120, where it is moved into substrate carrier 125 and stored to await further processing.

In another embodiment, the sub-sections of the pre-convert section are arranged in series rather than in parallel.

FIG. 3 shows a two-step conversion tool 200 for conversion of precursor on a substrate, which includes a load station 205, a pre-convert section 210, a pattern convert section 215, and an unload station 220. A first substrate carrier 225, located at load station 205, delivers substrate 130 to an airtrack 230 from a stack of substrates stored in first substrate carrier 225. The airtrack 230 delivers substrate 130 to pre-convert section 210, where substrate 130 is delivered to first hotplate 240 under first lamp 235, then to second hotplate 250 under second lamp 245, and then to third hotplate 250 under third lamp 255, where substrate 130 is exposed to light, heat, or both energy forms at these locations. Substrate 130 proceeds through pre-convert section 210 to pattern convert section 215 via airtrack 230 in a continuous flow. Once substrate 130 arrives at pattern convert section 215, it is positioned on alignment stage 265 and subjected to energy emanating from high intensity lamp 270. The light energy from high intensity lamp 270 is directed through a mask 275 and optics 280 to strike substrate 130. As a result, substrate 130 is patterned with the shape of mask 275. Substrate 130 then proceeds via airtrack 230 to unload station 220, where it is moved into substrate carrier 225 and stored to await further processing.

FIG. 4 shows the method steps of a two-step conversion of precursor, and includes:

Step 400: Applying precursor
In this step, the precursor/solvent mix is applied to the substrate, for example, by conventional methods such as spin or spray coating.

Step 410: Pre-baking
Excess solvent and/or other volatile components can be removed from the substrate, for example, either via a conventional drying oven or via evaporation.

Step 420: Pre-converting (exposing)
Lamps and/or hot plates (as shown in FIGS. 1 and 2) can supply light and/or heat energy to partially convert the precursor.

Step 430: Pattern conversion
Upon exposure to a high intensity lamp through a mask, as shown in FIGS. 1 and 2, the partially converted portions of the precursor can be further, preferably completely, converted and patterned, e.g., to amorphous metal or metal oxide. Other potential energy sources include a thermal, UV, e-beam, or plasma source, and these sources may be used in varied atmospheres (e.g., a vacuum or an inert atmosphere).

Step 440: Developing
The patterned substrates can be developed, e.g, via dipping or spraying with solvent to wash away unconverted precursor material.

Step 450: Post-processing
Additional steps may be performed if necessary to complete the present fabrication level.

FIG. 5 illustrates the relationship between the pre-conversion exposure dose and the subsequent solubility of the pre-exposed film (in a suitable developer) after that step. The shaded area represents pre-conversion doses that will not cause complete conversion. The dotted line indicates the best pre-conversion exposure dose that can be selected to maximize the dose without causing complete conversion of the precursor. This dose saves the greatest amount of time in the process. However, the selected pattern dose must also yield a high-resolution image. This determination requires additional analysis and is described below.

FIGS. 6a and 6b illustrate the relationship between pre-conversion exposure dose and pattern conversion exposure dose. The curve shown in FIG. 6a is the curve of acceptable pattern resolution. Any point lying above the curve in FIG. 6a represents a process that would yield a fully converted film (i.e., material with no solubility in a suitable developer). The pre-conversion exposure dose is selected so that the sum of the pre-conversion exposure dose and the pattern conversion exposure dose ("dose to clear") should substantially convert the selected precursor material. FIG. 6b illustrates what some regions of the curve mean in terms of pattern resolution. At a very low pre-conversion exposure dose, insufficient pre-conversion occurs. Although acceptable pattern resolution can be achieved at that dose, little time is saved in this region under those circumstances. The zero slope region in the middle of the curve offers the ideal range of pre-conversion exposure dose and acceptable pattern resolution because it maximizes the pre-conversion exposure dose and minimizes the pattern exposure dose. If the pre-conversion exposure dose is too high, the precursor can be overdeveloped and may not be able to be patterned with an acceptable resolution.

FIG. 7 illustrates the method steps of selecting pre-conversion exposure dose and pattern exposure dose to be used in the pre-convert section and the pattern convert section of the dual conversion tool shown in FIGS. 2 and 3 above. The steps include:

Step 700: Experimentally determining percent material converted vs. pre-conversion exposure dose
In this step, a specific precursor material is used to determine the percent precursor material converted for varying pre-conversion exposure doses. The experimental results are used to create a graph similar to the one shown in FIG. 5 above.

Step 710: Selecting maximum pre-conversion exposure dose
Using the graph developed in Step 700 above, a pre-conversion exposure dose is selected to maximize the dose but not exceed the dose where bulk conversion of the precursor material occurs.

Step 730: Determining Pattern exposure dose that gives acceptable pattern resolution A new set of curves is developed to indicate the relationship between pre-conversion exposure dose and pattern conversion exposure dose, as shown in FIGS. 6*a* and 6*b*. Using a specific precursor and a specific pre-conversion exposure dose, a series of substrates with applied precursor are converted and developed at varying pattern exposure doses and the resultant pattern resolution is measured. The point at which good resolution first occurs is the pattern conversion exposure dose to be shown on the curve (called the "curve of acceptable pattern resolution" in FIGS. 6*a* and 6*b*). The experiment is repeated using varying pre-conversion exposure doses until the curve is complete.

Using the curve, an appropriate pattern exposure dose is determined based on the chosen pre-conversion exposure dose. A pattern exposure dose and a pre-conversion exposure dose that corresponds to a point on the curve should yield a good quality image with adequate resolution.

As used herein, depositing of metal or metal oxide on a substrate means that a layer of metal or metal oxide is formed and is sufficiently adherent to the substrate.

It is understood, of course, that by "substantially developable" is meant that the extent to which the material is developable is sufficient to result in a pattern after development which meets all mandated specifications for which the pattern is to be employed. These specifications may include, but are not limited to, dimensional specifications (thickness, spatial resolution, surface roughness, sidewall profile and roughness, and others), and materials specifications (physical, optical, electrical, magnetic and other properties).

Also, as used herein, the terms "patterning conversion" and "patterning energy exposure dose" refer to using a converting means according to the invention such that the material to be patterned is exposed to a dose of energy sufficient to convert about 80%, preferably about 95%, more preferably about 99%, of the precursor material to metal or metal oxide. Energy above or beyond that sufficient to convert about 80%, preferably about 95%, more preferably about 99%, of the precursor material to metal or metal oxide is generally not considered part of pattern conversion. When more than one pattern conversion is undertaken, the pattern conversion energy exposure dose is taken to be the combination of all the pattern conversion steps, again provided that the dose is sufficient to convert about 80%, preferably about 95%, more preferably about 99%, of the precursor material to metal or metal oxide.

EXAMPLES

The following examples are only representative of the methods and materials for use in the apparati, methods, and processes of this invention, and are not to be construed as limiting the scope of the invention in any way.

Examples 1–6

Determining the Relationship Between Exposure Doses and Precursor Conversion or Film Thickness of a Deposited Zirconia Layer on a Substrate According to the Invention For Examples 1–3, zirconium precursor material with an acetoacetonate ligand, $Zr(AcAc)_4$, dissolved in toluene, was spun onto silicon wafers at about 1250 rpm for about 30 seconds, resulting in a precursor film of approximately 440

A. The film of Example 1 was formed by thermal conversion on a hot plate at about 180° C. for about 1 hour. The film of Example 2 was formed by photochemical conversion using a Karl Suss MJB-3 mask aligner with a 220 nm cold mirror. Due to the low intensity output of the mask aligner at DUV (~0.38 mW/cm$^2$), the exposure time was about 5 hours (dose where additional exposure does not lead to further thickness reduction). The film of Example 3 was formed by taking the film of Example 1 and further performing thermal conversion at about 180° C. for about an additional 1 to 3 hours.

The thickness and refractive index (see FIG. 8—numerals on curves represent the corresponding Example) of each of the resulting films were measured using variable angle spectroscopic ellipsometry (VASE). These results demonstrate that there are significant differences in the refractive index properties for each of the samples which are directly related to the chemical composition of the precursor and to the method by which it was prepared. The thicknesses were as follows:

|  | initial precursor film | ~440 Å |
|---|---|---|
| Example 1 | photoconverted film | ~330 Å |
| Example 2 | thermally converted film | ~360 Å |
| Example 3 | film having extended thermal conversion | ~320 Å |

For Examples 4–6, zirconium precursor material with a 2-ethyl hexanoate ligand, $Zr(carboxylate)_4$, dissolved in hexanes, was spun onto silicon wafers at about 1500 rpm for about 30 seconds, resulting in a precursor film of approximately 2340 Å. The film of Example 4 was formed by thermal conversion of the precursor material on a hot plate at about 180° C. for about 3 hours. The film of Example 5 was formed by photochemical conversion of the precursor using a Karl Suss MJB-3 mask aligner with a 220 nm cold mirror. Due to the low photosensitivity of this precursor and the low exposure intensity, the exposure time was lengthy, i.e., about 30 hours. The film of Example 6 was formed by taking the film of Example 4 and further performing thermal conversion at about 180° C. for about an additional 3 hours.

The thickness and refractive index (see FIG. 8—numerals on curves represent the corresponding Example) of each of the resulting films were measured using variable angle spectroscopic ellipsometry (VASE). These results demonstrate that there are significant differences in the refractive index properties for each of the samples which are directly related to the chemical composition of the precursor and to the method by which it was prepared. The thicknesses were as follows:

|  | initial precursor film | ~2340 Å |
|---|---|---|
| Example 4 | photochemically converted film | ~1490 Å |
| Example 5 | thermally converted film | ~1140 Å |
| Example 6 | film having extended thermal conversion | ~980 Å |

Examples 7–9

Figure 9:
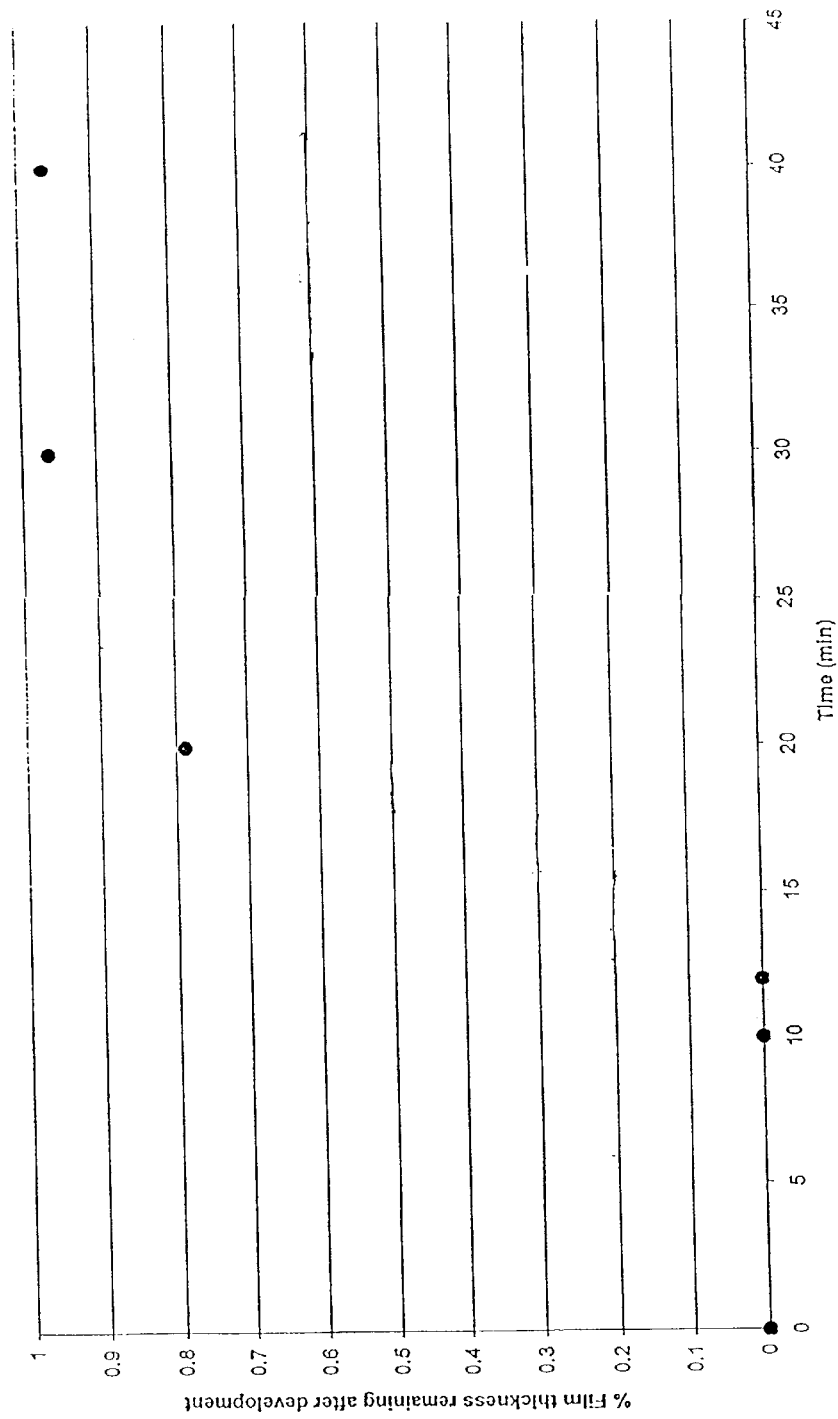
FIG. 9 shows a thermal contrast curve for a barium strontium titanate-forming precursor.

Effect of the Type of Conversion on the Properties of Barium Strontium Titanate Layers on a Substrate Example 7 demonstrates how thermal treatment may be used to convert a precursor film to an amorphous film of desired material. For Examples 7–9, a series of bare silicon wafers was spin-coated with a solution of precursor designed to form BST upon conversion. The wafers were subjected to at least a partial conversion step, which in the case of Example 7 involved heating at about 160° C. for a total time of about 120 minutes in intervals of about 10 minutes. After each conversion interval, the precursor pattern was developed by rinsing with isopropanol to remove the unconverted precursor. This allowed for a determination of the time required to thermally print the film, i.e., to have a substantial amount of film remaining after development with isopropanol. As shown in FIG. 9, this time was determined to be approximately 20 minutes for thermal conversion.

Figure 10:
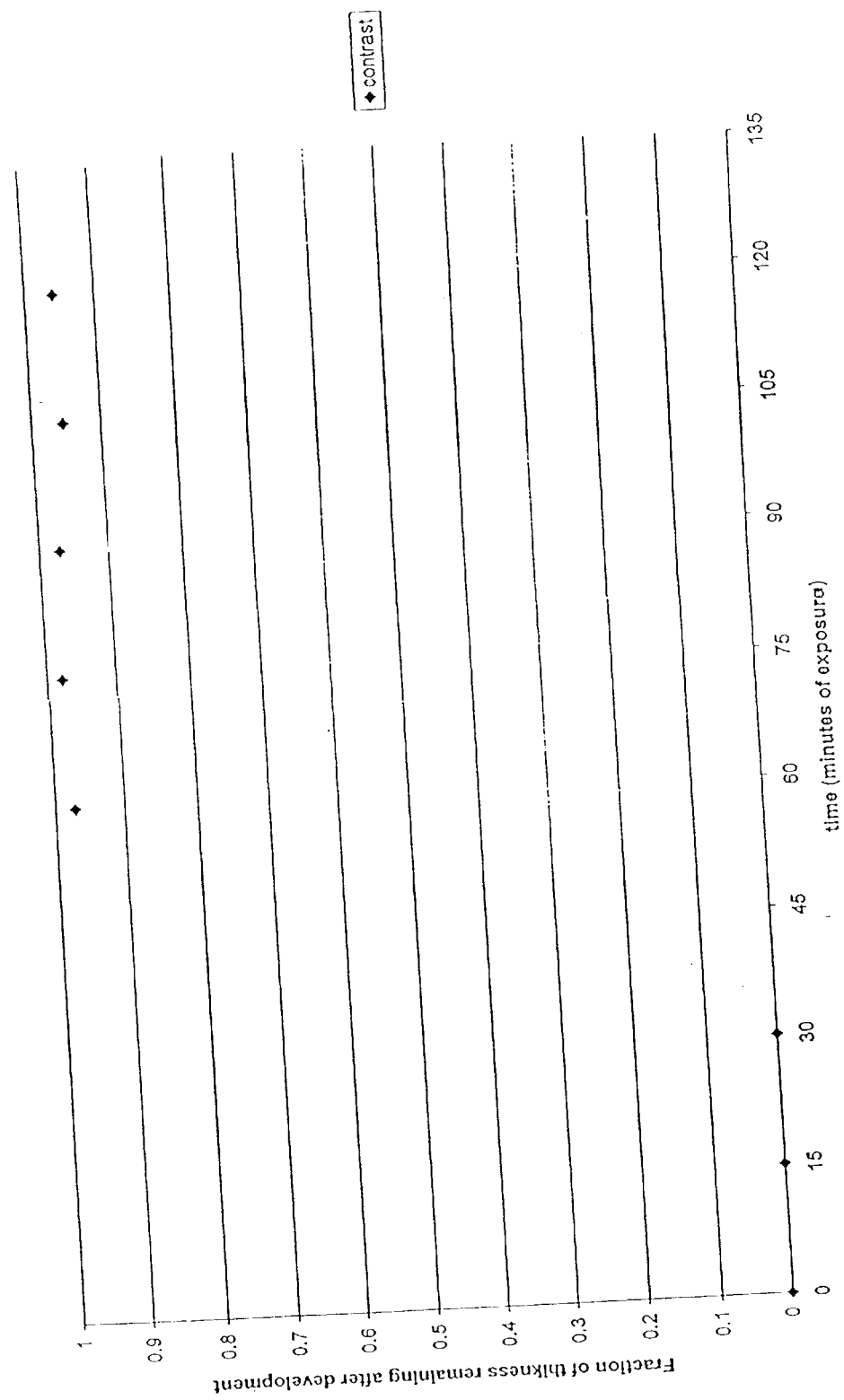
FIG. 10 shows a photochemical contrast curve for a barium strontium titanate-forming precursor.

Example 8 involved a similar experiment conducted by substituting, for thermal conversion, photochemical conversion; these results are shown in FIG. 10. This figure demonstrates that the time required to photochemically print the film was in the range of about 30 minutes to about 60 minutes.

In Example 9, designed to combine thermal partial conversion or 30 pretreatment with photochemical conversion, wafers were subjected to a thermal pretreatment of 160° C. for 10 minutes, then subjected to the above-described photochemical conversion procedure. The results are shown in FIG. 11.

Examples 10–11

Effect of Layer Composition on the Properties of Electron-Beam Converted Metal-Containing Layers on a Substrate Electron-Beam contrast of BST (Example 10) and PZT (Example 11) was performed to determine the photospeed of these materials by exposing a series of fully converted films of each material to increasing doses of the e-beam and noting, after development, the highest dose at which the fraction of film remained at zero and the lowest dose at which the fraction of film remaining reached a value of about 1. The contrast for PZT and BST occurs at about the same range for each, from about 60 to about 100 $\mu C/cm^2$.

It is to be understood that the invention is not to be limited to the exact configuration as illustrated and described herein. Accordingly, all expedient modifications readily attainable by one of ordinary skill in the art from the disclosure set forth herein, or by routine experimentation therefrom, are deemed to be within the spirit and scope of the invention as defined by the appended claims.

What is claimed is:

1. A method of converting an organometallic precursor material to a metal-containing pattern adherent to a substrate, comprising:
   applying the organometallic precursor material in an amount sufficient to coat at least a portion of the substrate, wherein said organometallic precursor material is adapted to be converted to form a metal or metal oxide;
   pre-converting the organometallic precursor material by exposing the organometallic precursor material to a pre-conversion energy exposure dose such that the pre-converted precursor material is not converted to a degree sufficient to impair pattern resolution;
   pattern converting a portion of the pre-converted precursor material to convert this portion to a pattern-converted material to an extent sufficient to thereby form a pattern on the substrate; and
   developing the portion of the pre-converted precursor material that was not pattern-converted such that the pattern remains on the substrate after developing.

2. The method of claim 1, wherein the pattern conversion comprises exposing the pre-converted precursor material to a patterning energy exposure dose, which converts the pre-converted precursor material to metal or metal oxide that adheres to the substrate to an extent sufficient to thereby form a deposited pattern thereon.

3. The method of claim 2, wherein the pre-conversion energy exposure dose is selected to be about 20% or less of the combination of the pre-conversion energy exposure dose and the patterning energy exposure dose, such that the pre-converted precursor material is substantially developable.

4. The method of claim 2, wherein the pre-conversion energy exposure dose is selected to be from about 20% to about 50% of the combination of the pre-conversion energy exposure dose and the patterning energy exposure dose, such that the pre-converted precursor material is substantially developable.

5. The method of claim 1, wherein the pre-conversion, the pattern-conversion, or both, comprises photochemical metal organic deposition.

6. The method of claim 1, wherein the pre-conversion comprises forming a metal or metal oxide within the organometallic precursor material.

7. The method of claim 1, wherein the pre-conversion energy exposure dose is selected to be from about 30% to about 80% of a maximum pre-conversion energy exposure dose, wherein the maximum pre-conversion energy exposure dose is that energy dose above which the organometallic precursor material exposed to the pre-conversion energy exposure dose is no longer substantially developable or above which the organometallic precursor material exposed to the pre-conversion energy exposure dose adheres to the substrate to a degree sufficient to impair pattern resolution, wherein the organometallic precursor material exposed to the pre-conversion energy exposure dose is substantially developable.

8. The method of claim 1, wherein the pre-conversion energy exposure dose is selected to be about 50% or more of a maximum pre-conversion energy exposure dose, wherein the maximum pre-conversion energy exposure dose is that energy dose above which the organometallic precursor material exposed to the pre-conversion energy exposure dose is no longer substantially developable or above which the organometallic precursor material exposed to the pre-conversion energy exposure dose adheres to the substrate to a degree sufficient to impair pattern resolution, wherein the organometallic precursor material exposed to the pre-conversion energy exposure dose is substantially developable.

9. The method of claim 1, wherein the pre-conversion energy exposure dose is selected to be from about 60% to about 99% of a maximum pre-conversion energy exposure dose, wherein the maximum pre-conversion energy exposure dose is that energy dose above which the organometallic precursor material exposed to the pre-conversion energy exposure dose is no longer substantially developable or above which the organometallic precursor material exposed to the pre-conversion energy exposure dose adheres to the substrate to a degree sufficient to impair pattern resolution, wherein the organometallic precursor material exposed to the pre-conversion energy exposure dose is substantially developable.

10. A substrate containing a patterned metal or metal oxide layer formed according to the method of claim 1.

11. The method according to claim 1, wherein the pre-conversion comprises exposing the precursor material to a heat source, and wherein the pattern-conversion comprises exposing the pre-converted precursor material to a light source.

12. The method according to claim 1, wherein the pre-conversion comprises exposing the precursor material to a heat source, and wherein the pattern-conversion comprises exposing the pre-converted precursor material to an electron-beam source.

13. The method according to claim 1, wherein the pre-conversion comprises exposing the precursor material to an electron-beam source, and wherein the pattern-conversion comprises exposing the pre-converted precursor material to a light source.

14. The method according to claim 1, wherein the pre-conversion comprises exposing the precursor material to a light source, and wherein the pattern-conversion comprises exposing the pre-converted precursor material to a light source.

15. A method of converting an organometallic precursor material to a metal-containing pattern adherent to a substrate, comprising:
  applying the organometallic precursor material in an amount sufficient to coat at least a portion of the substrate, wherein said organometallic precursor material is adapted to be converted to form a metal or metal oxide;
  pre-converting the organometallic precursor material by exposing the organometallic precursor material to a pre-conversion energy exposure dose such that the pre-converted precursor material is not converted to a degree sufficient to impair pattern resolution;
  pattern converting a first portion of the pre-converted precursor material to convert this portion to a pattern-converted material to an extent sufficient to thereby form a first pattern on the substrate;
  pattern converting a second portion of the pre-converted precursor material to convert this portion to a pattern-converted material an extent sufficient to thereby form a second pattern on the substrate; and
  developing the second portion of the pre-converted precursor material that was pattern-converted such that the second pattern remains on the substrate after developing.

16. The method of claim 15, wherein the pattern conversion comprises exposing the pre-converted precursor material to a patterning energy exposure dose, which converts the pre-converted precursor material to metal or metal oxide that adheres to the substrate to an extent sufficient to thereby form a deposited pattern thereon.

17. The method of claim 16, wherein the pre-conversion energy exposure dose is selected to be about 20% or less of the combination of the pre-conversion energy exposure dose and the patterning energy exposure dose, such that the pre-converted precursor material is substantially developable.

18. The method of claim 16, wherein the pre-conversion energy exposure dose is selected to be from about 20% to about 50% of the combination of the pre-conversion energy exposure dose and the patterning energy exposure dose, such that the pre-converted precursor material is substantially developable.

19. The method of claim 15, wherein the pre-conversion, the pattern-conversion, or both, comprises photochemical metal organic deposition.

20. The method of claim 15, wherein the pre-conversion comprises forming a metal or metal oxide within the organometallic precursor material.

21. The method of claim 15, wherein the pre-conversion energy exposure dose is selected to be from about 30% to about 80% of a maximum pre-conversion energy exposure dose, wherein the maximum pre-conversion energy exposure dose is that energy dose above which the organometallic precursor material exposed to the pre-conversion energy exposure dose is no longer substantially developable or above which the organometallic precursor material exposed to the pre-conversion energy exposure dose adheres to the substrate to a degree sufficient to impair pattern resolution, wherein the organometallic precursor material exposed to the pre-conversion energy exposure dose is substantially developable.

22. The method of claim 15, wherein the pre-conversion energy exposure dose is selected to be about 50% or more of a maximum pre-conversion energy exposure dose, wherein the maximum pre-conversion energy exposure dose is that energy dose above which the organometallic precursor material exposed to the pre-conversion energy exposure dose is no longer substantially developable or above which the organometallic precursor material exposed to the pre-conversion energy exposure dose adheres to the substrate to a degree sufficient to impair pattern resolution, wherein the organometallic precursor material exposed to the pre-conversion energy exposure dose is substantially developable.

23. The method of claim 15, wherein the pre-conversion energy exposure dose is selected to be from about 60% to about 99% of a maximum pre-conversion energy exposure dose, wherein the maximum pre-conversion energy exposure dose is that energy dose above which the organometallic precursor material exposed to the pre-conversion energy exposure dose is no longer substantially developable or above which the organometallic precursor material exposed to the pre-conversion energy exposure dose adheres to the substrate to a degree sufficient to impair pattern resolution, wherein the organometallic precursor material exposed to the pre-conversion energy exposure dose is substantially developable.

24. A substrate containing a patterned metal or metal oxide layer formed according to the method of claim 15.

25. The method according to claim 15, wherein the pre-conversion comprises exposing the precursor material to a heat source, and wherein the pattern-conversion comprises exposing the pre-converted precursor material to a light source.

26. The method according to claim 15, wherein the pre-conversion comprises exposing the precursor material to a heat source, and wherein the pattern-conversion comprises exposing the pre-converted precursor material to an electron-beam source.

27. The method according to claim 15, wherein the pre-conversion comprises exposing the precursor material to an electron-beam source, and wherein the pattern-conversion comprises exposing the pre-converted precursor material to a light source.

28. The method according to claim 15, wherein the pre-conversion comprises exposing the precursor material to a light source, and wherein the pattern-conversion comprises exposing the pre-converted precursor material to a light source.

29. A method of selecting a pre-conversion energy exposure dose and a patterning energy exposure dose to be used in converting an organometallic precursor material to a metal-containing patterned layer comprising at least two pattern elements that are adherent to a substrate, which method comprises:

determining a relationship between the pre-conversion energy exposure dose in the conversion and the amount of pre-converted precursor material that adheres to the substrate; and selecting a pre-conversion energy exposure dose that is less than a maximum pre-conversion energy exposure dose, wherein the maximum pre-conversion energy exposure dose is that energy dose above which the organometallic precursor material exposed to the pre-conversion energy exposure dose is no longer substantially developable or above which the organometallic precursor material exposed to the pre-conversion energy exposure dose adheres to the substrate to a degree sufficient to impair pattern resolution, such that the patterning energy exposure dose t yields an acceptable pattern resolution on the substrate, wherein the acceptable pattern resolution is such that the at least two elements of the metal-containing patterned layer are discrete and not connected by like material.

30. The method of claim 29, further comprising identifying a maximum pre-conversion energy exposure dose based on the dose-conversion relationship, such that the organometallic precursor material exposed to the pre-conversion energy exposure dose, but not to the patterning energy exposure dose is substantially removable during developing.

31. The method of claim 29, wherein the pre-conversion energy exposure dose is selected to be about 20% or less of the combination of the pre-conversion energy exposure dose and the patterning energy exposure dose, such that the pre-converted precursor material is substantially developable.

32. The method of claims 29, wherein the pre-conversion energy exposure dose is selected to be from about 20% to about 50% of the combination of the pre-conversion energy exposure dose and the patterning energy exposure dose, such that the pre-converted precursor material is substantially developable.

33. The method of claim 29, wherein the pre-conversion energy exposure dose is selected to be from about 30% to about 80% of a maximum pre-conversion energy exposure dose, wherein the maximum pre-conversion energy exposure dose is that energy dose above which the organometallic precursor material exposed to the pre-conversion energy exposure dose is no longer substantially developable or above which the organometallic precursor material exposed to the pre-conversion energy exposure dose adheres to the substrate to a degree sufficient to impair pattern resolution, wherein the organometallic precursor material exposed to the pre-conversion energy exposure dose is substantially developable.

34. The method of claim 29, wherein the pre-conversion energy exposure dose is selected to be about 50% or more of a maximum pre-conversion energy exposure dose, wherein the maximum pre-conversion energy exposure dose is that energy dose above which the organometallic precursor material exposed to the pre-conversion energy exposure dose is no longer substantially developable or above which the organometallic precursor material exposed to the pre-conversion energy exposure dose adheres to the substrate to a degree sufficient to impair pattern resolution, wherein the organometallic precursor material exposed to the pre-conversion energy exposure dose is substantially developable.

35. The method of claim 29, wherein the pre-conversion energy exposure dose is selected to be from about 60% to about 99% of a maximum pre-conversion energy exposure dose, wherein the maximum pre-conversion energy exposure dose is that energy dose above which the organometallic precursor material exposed to the pre-conversion energy exposure dose is no longer substantially developable or above which the organometallic precursor material exposed to the pre-conversion energy exposure dose adheres to the substrate to a degree sufficient to impair pattern resolution, wherein the organometallic precursor material exposed to the pre-conversion energy exposure dose is substantially developable.

* * * * *